US010462579B2

(12) United States Patent
Barzen

(10) Patent No.: US 10,462,579 B2
(45) Date of Patent: Oct. 29, 2019

(54) SYSTEM AND METHOD FOR A MULTI-ELECTRODE MEMS DEVICE

(71) Applicant: Infineon Technologies AG, Neubiberg (DE)

(72) Inventor: Stefan Barzen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/981,714

(22) Filed: May 16, 2018

(65) Prior Publication Data

US 2018/0262843 A1 Sep. 13, 2018

Related U.S. Application Data

(62) Division of application No. 14/818,007, filed on Aug. 4, 2015, now Pat. No. 10,003,889.

(51) Int. Cl.

| | |
|---|---|
| ***H01L 41/083*** | (2006.01) |
| ***H04R 19/00*** | (2006.01) |
| ***H04R 31/00*** | (2006.01) |
| *H04R 7/10* | (2006.01) |

(52) U.S. Cl.

CPC ........... *H04R 19/005* (2013.01); *H04R 31/00* (2013.01); *H04R 7/10* (2013.01); *H04R 2307/025* (2013.01); *H04R 2307/027* (2013.01)

(58) Field of Classification Search

CPC ...... H04R 3/00; H04R 19/005; H04R 19/016; H04R 31/00; H04R 1/086

See application file for complete search history.

(56) References Cited

U.S. PATENT DOCUMENTS

| | | | | |
|---|---|---|---|---|
| 5,142,511 | A * | 8/1992 | Kanai | B06B 1/0625 310/358 |
| 7,579,753 | B2 * | 8/2009 | Fazzio | G01H 11/08 310/322 |
| 7,888,840 | B2 | 2/2011 | Shimaoka et al. | |
| 8,389,317 | B2 | 3/2013 | Huang | |
| 9,380,380 | B2 * | 6/2016 | Kasai | H04R 3/00 |
| 9,843,868 | B2 | 12/2017 | Kasai et al. | |
| 2014/0010374 | A1 | 1/2014 | Kasai et al. | |

(Continued)

FOREIGN PATENT DOCUMENTS

| | | | |
|---|---|---|---|
| CN | 101898745 | A | 12/2010 |
| DE | 102006012856 | A1 | 9/2007 |
| EP | 1063866 | A1 | 12/2000 |

(Continued)

OTHER PUBLICATIONS

Ren, et al., "A Bi-Directional Out-of-Plane Actuator by Electrostatic Force," Micromachines, No. 4, Dec. 5, 2013, pp.431-443.

*Primary Examiner* — Amir H Etesam

(74) *Attorney, Agent, or Firm* — Slater Matsil, LLP

(57) ABSTRACT

According to an embodiment, a MEMS transducer includes a stator, a rotor spaced apart from the stator, and a multi-electrode structure including electrodes with different polarities. The multi-electrode structure is formed on one of the rotor and the stator and is configured to generate a repulsive electrostatic force between the stator and the rotor. Other embodiments include corresponding systems and apparatus, each configured to perform corresponding embodiment methods.

20 Claims, 16 Drawing Sheets

(56) References Cited

U.S. PATENT DOCUMENTS

| | | | | |
|---|---|---|---|---|
| 2014/0294218 | A1 | 10/2014 | Suvanto et al. | |
| 2015/0281818 | A1* | 10/2015 | Doller | H04R 19/005 381/111 |

FOREIGN PATENT DOCUMENTS

| | | | |
|---|---|---|---|
| JP | 2001016675 | A | 1/2001 |
| KR | 20130091773 | A | 8/2013 |

* cited by examiner

SYSTEM AND METHOD FOR A MULTI-ELECTRODE MEMS DEVICE

CROSS-REFERENCE TO RELATED APPLICATIONS

This is a divisional application of U.S. application Ser. No. 14/818,007, entitled "System and Method for a Multi-Electrode MEMS Device," filed on Aug. 4, 2015 which application is incorporated herein by reference in its entirety.

TECHNICAL FIELD

The present invention relates generally to microelectromechanical systems (MEMS), and, in particular embodiments, to a system and method for a multi-electrode MEMS device.

BACKGROUND

Transducers convert signals from one domain to another. For example, some sensors are transducers that convert physical signals into electrical signals. On the other hand, some transducers convert electrical signals into physical signals. A common type of sensor is a pressure sensor that converts pressure differences and/or pressure changes into electrical signals. Pressure sensors have numerous applications including, for example, atmospheric pressure sensing, altitude sensing, and weather monitoring. Another common type of sensor is a microphone that converts acoustic signals into electrical signals.

Microelectromechanical systems (MEMS) based transducers include a family of transducers produced using micromachining techniques. MEMS, such as a MEMS pressure sensor or a MEMS microphone, gather information from the environment by measuring the change of physical state in the transducer and transferring the signal to be processed by the electronics, which are connected to the MEMS sensor. MEMS devices may be manufactured using micromachining fabrication techniques similar to those used for integrated circuits.

MEMS devices may be designed to function as oscillators, resonators, accelerometers, gyroscopes, pressure sensors, microphones, microspeakers, and/or micro-mirrors, for example. Many MEMS devices use capacitive sensing techniques for transducing the physical phenomenon into electrical signals. In such applications, the capacitance change in the sensor is converted to a voltage signal using interface circuits.

Microphones and microspeakers may also be implemented as capacitive MEMS devices that include deflectable membranes and rigid backplates. For a microphone, an acoustic signal as a pressure difference causes the membrane to deflect. Generally, the deflection of the membrane causes a change in distance between the membrane and the backplate, thereby changing the capacitance. Thus, the microphone measures the acoustic signal and generates an electrical signal. For a microspeaker, an electrical signal is applied between the backplate and the membrane at a certain frequency. The electrical signal causes the membrane to oscillate at the frequency of the applied electrical signal, which changes the distance between the backplate and the membrane. As the membrane oscillates, the deflections of the membrane cause local pressure changes in the surrounding medium and produce acoustic signals, i.e., sound waves.

In MEMS microphones or microspeakers, as well as in other MEMS devices that include deflectable structures with applied voltages for sensing or actuation, pull-in or collapse is a common issue. If a voltage is applied to the backplate and the membrane, there is a risk of sticking as the membrane and the backplate move closer together during deflection. This sticking of the two plates is often referred to as pull-in or collapse and may cause device failure in some cases. Collapse generally occurs because the attractive force caused by a voltage difference between the membrane and the backplate may increase quickly as the distance between the membrane and the backplate decreases.

SUMMARY

According to an embodiment, a MEMS transducer includes a stator, a rotor spaced apart from the stator, and a multi-electrode structure including electrodes with different polarities. The multi-electrode structure is formed on one of the rotor and the stator and is configured to generate a repulsive electrostatic force between the stator and the rotor. Other embodiments include corresponding systems and apparatus, each configured to perform corresponding embodiment methods.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones and MEMS microspeakers. Some of the various embodiments described herein include MEMS transducer systems, MEMS microphone systems, dipole electrode MEMS transducers, multipole electrode MEMS transducers, and fabrications sequences for various multi-electrode MEMS device. In other embodiments, aspects may also be applied to other applications involving any type of transducer that includes a deflectable structure according to any fashion as known in the art.

According to various embodiments, MEMS microphones and MEMS microspeakers include multiple electrodes on the membrane, the backplate, or both. In such embodiments, separate electrodes are patterned on one or both of the capacitive plates of the MEMS acoustic transducer. The separate electrodes and the other capacitive plate, or other separate electrodes, are supplied with voltages in order to form an electrostatic field with a dipole or multipole pattern. In such fields, the membrane and backplate may be attracted for certain distances and repulsed for other distances. Thus, various embodiments include MEMS acoustic transducers capable of applying both attractive and repulsive electrostatic forces. Such embodiment MEMS acoustic transducers may operate with higher bias voltages and lower risk of collapse or pull-in, resulting in improved performance.

According to various embodiments, multiple types of multi-electrode structures are formed. Various MEMS acoustic transducers include single and double backplate MEMS microphones and MEMS microspeakers. In further embodiments, multi-electrode structures may be formed in other types of MEMS device that include deflectable structures, such as pressure sensors, gyroscopes, oscillators, actuators, and others, for example.

Figure 1:
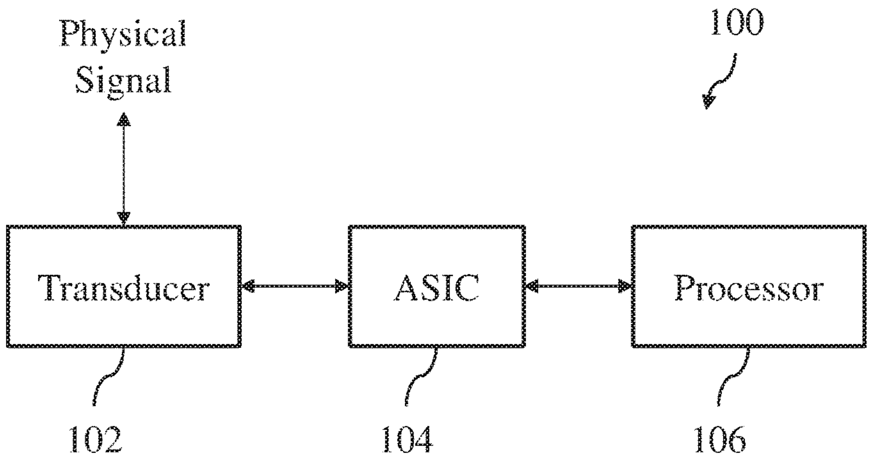
FIG. 1 illustrates a system block diagram of an embodiment MEMS transducer system.

FIG. 1 illustrates a system block diagram of an embodiment MEMS transducer system 100 including MEMS transducer 102, application specific integrated circuit (ASIC) 104, and processor 106. According to various embodiments, MEMS transducer 102 transduces physical signals. In embodiments where MEMS transducer 102 is an actuator, MEMS transducer 102 generates physical signals by moving a deflectable structure based on excitation from electrical signals. In embodiments where MEMS transducer 102 is a sensor, MEMS transducer 102 generates electrical signals by transducing physical signals that cause the deflectable structure to move and generate the electrical signals. In the various embodiments, MEMS transducer 102 includes a multi-electrode deflectable structure that produces a dipole type electric field or a multipole electric field as described further herein below.

In various embodiments, MEMS transducer 102 may be a MEMS microphone. In other embodiments, MEMS transducer 102 may be a MEMS microspeaker. In some applications, MEMS transducer 102 may be a MEMS acoustic transducer that both senses and actuates acoustic signals. For example, MEMS transducer 102 may be a combination acoustic sensor and actuator for high frequency applications, such as ultrasound transducers. In some embodiments, capacitive MEMS microphones may include a membrane and backplate with smaller surface areas and separation distances than typically found in capacitive MEMS microspeakers.

In various embodiments, ASIC 104 either generates the electrical signals for exciting MEMS transducer 102 or receives the electrical signals generated by MEMS transducer 102. ASIC 104 may also provide voltage bias or voltage drive signals to MEMS transducer 102 depending on various applications. In some embodiments, ASIC 104 includes an analog to digital converter (ADC) or a digital to analog converter (DAC). Processor 106 interfaces with ASIC 104 and generates drive signals or provides signal processing. Processor 106 may be a dedicated transducer processor, such as a CODEC for a MEMS microphone, or may be a general processor, such as a microprocessor.

Figure 2A:
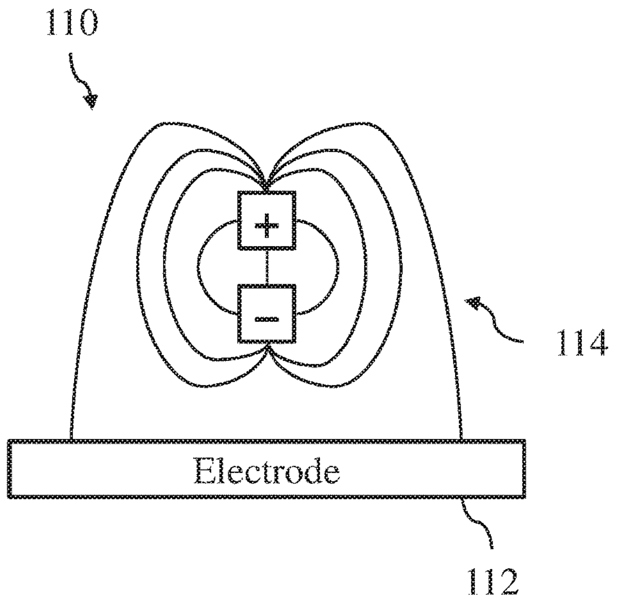
FIGS. 2*a* and 2*b* illustrate schematic diagrams of embodiment multi-electrode elements.
Figure 2B:
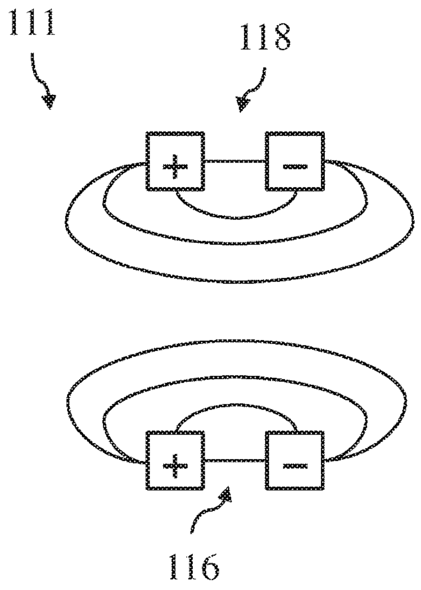

FIGS. 2*a* and 2*b* illustrate schematic diagrams of embodiment multi-electrode elements 110 and 111. FIG. 2*a* illustrates multi-electrode element 110, which includes dipole electrode 114 and electrode 112. According to various embodiments, dipole electrode 114 may be formed on a backplate in a MEMS microphone, for example, and electrode 112 may be a membrane in the MEMS microphone. Dipole electrode 114 includes a pole with a positive polarity and a pole with a negative polarity. In such embodiments, the positive and negative polarities are electrical potentials relative to each other. Thus, the positive and negative polarities may include two different positive voltages with respect to ground, two different negative voltages with respect to ground, or a positive and a negative voltage with respect to ground. Electrode 112 and dipole electrode 114 are driven with voltages to produce the electric field as shown (where the electric field lines are not necessarily drawn to scale). As illustrated, electrode 112 is indicated with a negative polarity. When electrode 112 is beyond a certain distance from dipole electrode 114, the electrostatic force acting between electrode 112 and dipole electrode 114 may be attractive. When electrode 112 is within the certain distance from dipole electrode 114, the electrostatic force acting between electrode 112 and dipole electrode 114 may be repulsive. Thus, as the membrane, with electrode 112, moves towards the backplate, with dipole electrode 114, the electrostatic force acting on the membrane is attractive initially and may become repulsive within a certain separation distance. Thus, in various embodiments, electrostatic repulsive forces may be used between the backplate and the membrane to prevent collapse or pull-in.

In other embodiments, dipole electrode 114 may be arranged on the membrane and electrode 112 may be arranged on the backplate. Further, an additional backplate may be included with either configuration. In further embodiments, dipole electrode 114 and electrode 112 may be included in any type of MEMS device with movable structure that have applied voltages or include electrodes, for example.

According to various embodiments, both the membrane and the backplate may include dipole electrodes or, more generally, both the fixed structure and the deflectable structure of a MEMS device may include dipole electrodes. FIG. 2*b* illustrates multi-electrode element 111, which includes dipole electrode 116 and dipole electrode 118. According to such embodiments, dipole electrode 116 is arranged on the membrane of a MEMS microphone and dipole electrode 118 is arranged on the backplate of the MEMS microphone. As described hereinabove in reference to FIG. 2*a*, depending on the voltages applied to, and the separation distance between, dipole electrode 116 and dipole electrode 118, the electrostatic forces acting on both dipoles may be arranged to be attractive or repulsive. Dipole electrode 116 and dipole electrode 118 each have a pole with a negative polarity and a pole with a positive polarity, which may include different positive or negative voltages with respect to ground. In such embodiments, multi-electrode element 111 may be referred to as a quadrupole. In various further embodiments, any number of electrodes, including dipole electrodes, may be patterned on a membrane or a backplate for a MEMS acoustic transducer, as described further herein below. In other embodiments, any number of electrodes, including dipole electrodes, may be patterned on movable or fixed structures in a MEMS device.

Figure 3A:
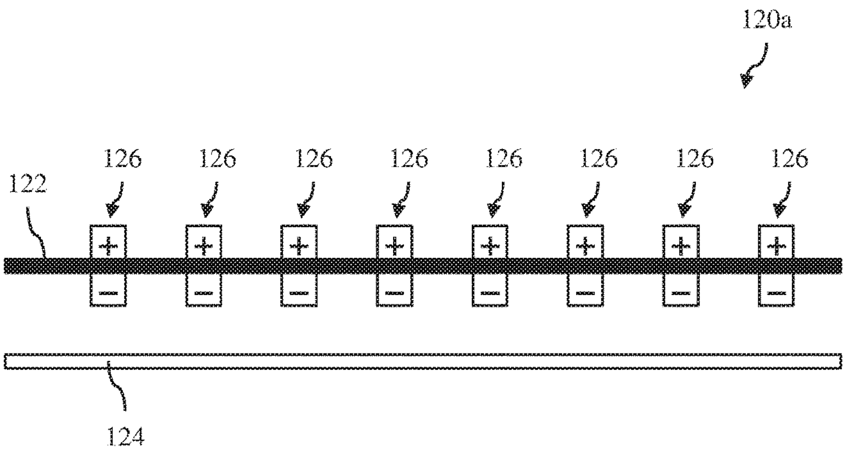
FIGS. 3*a*, 3*b*, 3*c*, 3*d*, 3*e*, and 3*f* illustrate side-view schematic diagrams of embodiment multi-electrode transducers.

FIGS. 3*a*, 3*b*, 3*c*, 3*d*, 3*e*, and 3*f* illustrate side-view schematic diagrams of embodiment multi-electrode transducers 120*a*, 120*b*, 120*c*, 120*d*, 120*e*, and 120*f*. FIG. 3*a* illustrates multi-electrode transducer 120*a* including isolating plate 122, conductive plate 124, and dipole electrodes 126 on isolating plate 122. According to various embodiments, each of dipole electrodes 126 operates with conductive plate 124 as described hereinabove in reference to FIG. 2*a*. Isolating plate 122 is the membrane of a MEMS acoustic transducer and conductive plate 124 is the backplate of the MEMS acoustic transducer in some embodiments. In other embodiments, isolating plate 122 is the backplate of the MEMS acoustic transducer and conductive plate 124 is the membrane of the MEMS acoustic transducer. In various embodiments, the membrane (either conductive plate 124 or isolating plate 122) may experience an attractive force for some separation distances and a repulsive force for other separation distances depending on the electric fields formed by conductive plate 124 and dipole electrodes 126.

According to various embodiments, each dipole electrode 126 is formed with a positive pole on a top surface of isolating plate 122 and a negative pole on a bottom surface of isolating plate 122. Isolating plate 122 may be an insulator in some embodiments. In alternative embodiments, isolating plate 122 may include a conductor, or conductors, with insulating layers formed on the top or bottom surfaces of the conductor, or conductors. In other embodiments, the positive pole of each dipole electrode 126 is formed on the bottom surface of isolating plate 122 and the negative pole of each dipole electrode 126 is formed on the top surface of isolating plate 122 (opposite as shown).

Figure 3B:
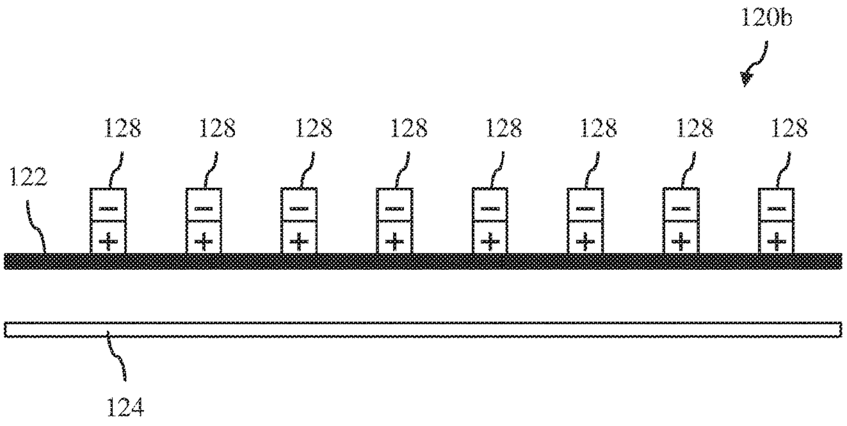

FIG. 3*b* illustrates multi-electrode transducer 120*b* including isolating plate 122, conductive plate 124, and dipole electrodes 128 on isolating plate 122. According to various embodiments, multi-electrode transducer 120*b* operates as similarly described hereinabove in reference to multi-electrode transducer 120*a*, with the exception that dipole electrodes 128 each include a positive pole and negative pole formed on a same side of isolating plate 122. Dipole electrodes 128 operate with conductive plate 124 as described hereinabove in reference to FIG. 2*a*. In such embodiments, the positive and negative poles of dipole electrodes 128 may be separated by some insulating material (not shown). Further, isolating plate 122 is an insulator in various embodiments. In alternative embodiments, isolating plate 122 may include a conductor with isolating layers formed on the top or bottom surfaces of the conductor. In such embodiments, dipole electrodes 128 may still be isolated from each other by isolating plate 122. In various embodiments, dipole electrodes 128 may be formed on either the top or bottom sides of isolating plate 122.

According to various embodiments, isolating plate 122 is the membrane of the MEMS acoustic transducer and conductive plate 124 is the backplate of the MEMS acoustic transducer in some embodiments. In other embodiments, isolating plate 122 is the backplate of the MEMS acoustic transducer and conductive plate 124 is the membrane of the MEMS acoustic transducer. In various embodiments, the membrane (either conductive plate 124 or isolating plate 122) may experience an attractive force for some separation distances and a repulsive force for other separation distances depending on the electric fields formed by conductive plate 124 and dipole electrodes 128.

Figure 3C:
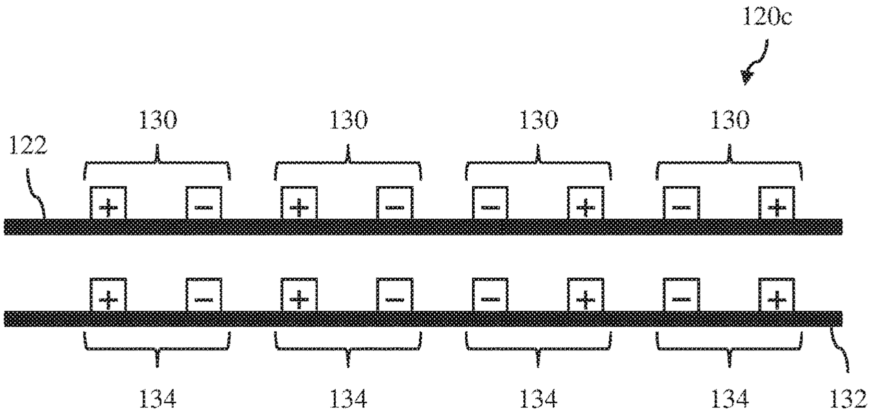

FIG. 3*c* illustrates multi-electrode transducer 120*c* including isolating plate 122, isolating plate 132, dipole electrodes 130 on isolating plate 122, and dipole electrodes 134 on isolating plate 132. According to various embodiments, dipole electrodes 128 and dipole electrodes 134 operate as described hereinabove in reference to FIG. 2*b*. In such embodiments, each of dipole electrodes 130 and dipole electrodes 134 includes a positive pole and a negative pole. Each of dipole electrodes 130 is formed on isolating plate 122 in line with a corresponding one of dipole electrodes 134 formed on isolating plate 132. For each dipole of dipole electrodes 130 and dipole electrodes 134, the axis, from negative to positive poles, of the corresponding dipoles are arranged in parallel to each other and perpendicular to the separation distance between the corresponding dipoles.

According to various embodiments, isolating plate 122 and isolating plate 132 are insulators. In alternative embodiments, isolating plate 122 and isolating plate 132 may include conductors with isolating layers formed on the top or bottom surfaces of the conductors. In such embodiments, dipole electrodes 130 and dipole electrodes 134 may still be isolated from each other by isolating plate 122 and isolating plate 132, respectively. In various embodiments, dipole electrodes 130 and dipole electrodes 134 may be formed on either the top or bottom sides of isolating plate 122 and isolating plate 132, respectively. Each corresponding pair of dipoles from dipole electrodes 130 and dipole electrodes 134 may be referred to as a quadrupole, as described hereinabove in reference to FIG. 2*b*.

According to various embodiments, isolating plate 122 is the membrane of the MEMS acoustic transducer and isolating plate 132 is the backplate of the MEMS acoustic transducer. In other embodiments, isolating plate 122 is the backplate of the MEMS acoustic transducer and isolating plate 132 is the membrane of the MEMS acoustic transducer. In various embodiments, the membrane (either isolating plate 132 or isolating plate 122) may experience an attractive force for some separation distances and a repulsive force for other separation distances depending on the electric fields formed by dipole electrodes 130 and dipole electrodes 134.

Figure 3D:
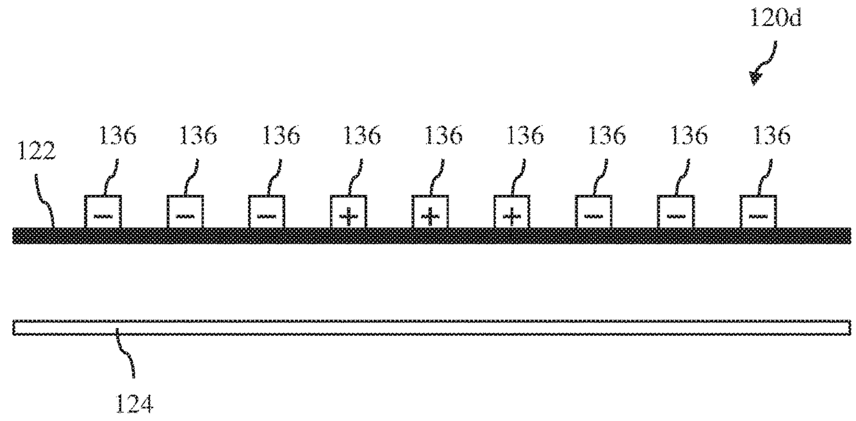

FIG. 3*d* illustrates multi-electrode transducer 120*d* including isolating plate 122, conductive plate 124, and electrodes 136. According to various embodiments, electrodes 136 may be connected together or be connected to separate charge sources. Electrodes 136 may include charges with a first polarity near the center and charges with a second polarity, opposite the first polarity, near the periphery. The charge distribution may be attained by a discontinuous distribution of electrodes with a definite amount of charge present on electrodes 136, such as described further herein below in reference to FIG. 4*c*. In various embodiments, conductive plate 124 and electrodes 136 operate in a similar manner as described hereinabove in reference to FIGS. 2*a* and 2*b*. In such embodiments, for some separation distances, an attractive force exists between conductive plate 124 and isolating plate 122 with electrodes 136. For other separation distances, a repulsive force exists between conductive plate 124 and isolating plate 122 with electrodes 136.

According to various embodiments, electrodes 136 may be formed on a top surface or a bottom surface of isolating plate 122. Isolating plate 122 is the membrane of the MEMS acoustic transducer and conductive plate 124 is the backplate of the MEMS acoustic transducer in some embodiments. In other embodiments, isolating plate 122 is the backplate of the MEMS acoustic transducer and conductive plate 124 is the membrane of the MEMS acoustic transducer. In various embodiments, the membrane (either isolating plate 122 or conductive plate 124) may experience an attractive force for some separation distances and a repulsive force for other separation distances depending on the electric fields formed by electrodes 136 and conductive plate 124.

Figure 3E:
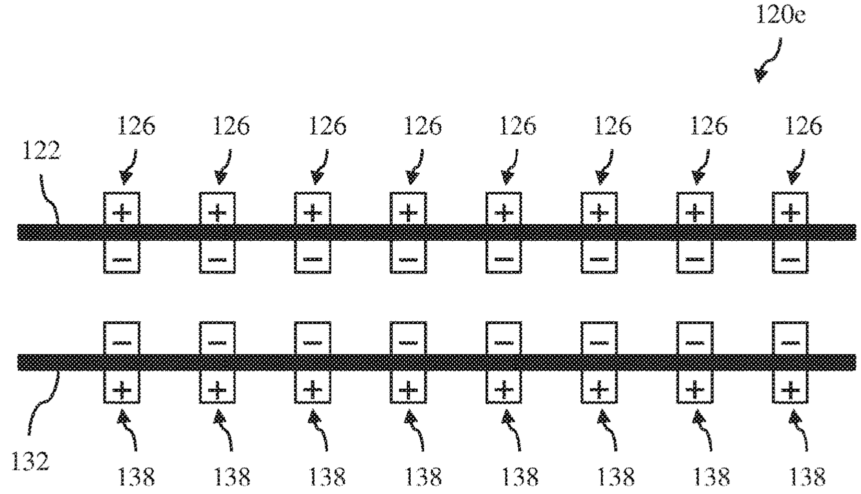

FIG. 3*e* illustrates multi-electrode transducer 120*e* including isolating plate 122, isolating plate 132, dipole electrodes 126 on isolating plate 122, and dipole electrodes 138 on isolating plate 132. According to various embodiments, each of dipole electrodes 126 operates with a corresponding one of dipole electrodes 138 to function in a similar manner as described hereinabove in reference to multi-electrode element 110 and multi-electrode element 111 in FIGS. 2*a* and 2*b*. Isolating plate 122 is the membrane of the MEMS acoustic transducer and isolating plate 132 is the backplate of the MEMS acoustic transducer in some embodiments. In other embodiments, isolating plate 122 is the backplate of the MEMS acoustic transducer and isolating plate 132 is the membrane of the MEMS acoustic transducer. In various embodiments, the membrane (either isolating plate 122 or isolating plate 132) may experience an attractive force for some separation distances and a repulsive force for other separation distances depending on the electric fields formed by dipole electrodes 126 and dipole electrodes 138.

According to various embodiments, each dipole electrode 126 is formed with a positive pole on a top surface of isolating plate 122 and a negative pole on a bottom surface of isolating plate 122. Similarly, each dipole electrode 138 is formed with a positive pole on a bottom surface of isolating plate 132 and a negative pole on a top surface of isolating plate 132. Isolating plate 122 and isolating plate 132 may each be an insulator in some embodiments. In other embodiments, isolating plate 122 and isolating plate 132 may each be a conductor with insulating layers formed on the top and bottom surfaces. In alternative embodiments, the positive pole of each dipole electrode 126 is formed on the bottom surface of isolating plate 122 and the negative pole of each dipole electrode 126 is formed on the top surface of isolating plate 122 (opposite as shown), while the positive pole of each dipole electrode 138 is formed on the top surface of isolating plate 132 and the negative pole of each dipole electrode 138 is formed on the bottom surface of isolating plate 132 (opposite as shown).

Figure 3F:
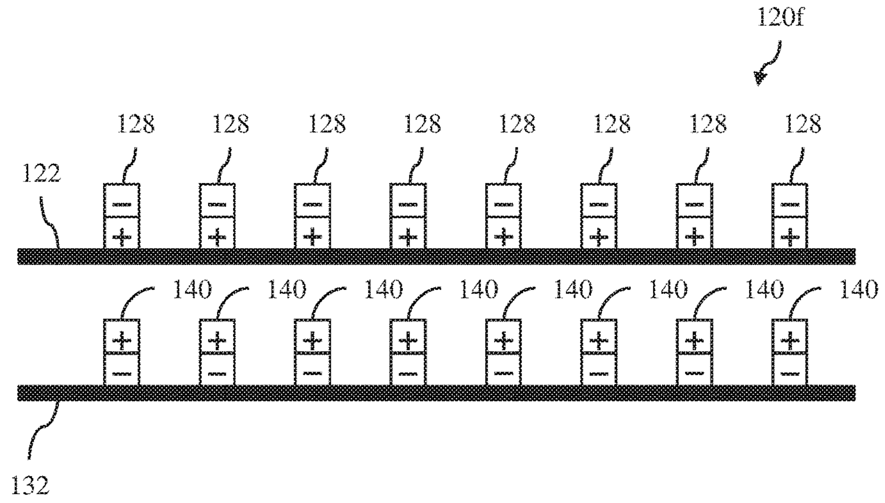

FIG. 3*f* illustrates multi-electrode transducer 120*f* including isolating plate 122, isolating plate 132, dipole electrodes 128 on isolating plate 122, and dipole electrodes 140 on isolating plate 132. According to various embodiments, multi-electrode transducer 120*f* operates as similarly described hereinabove in reference to multi-electrode transducer 120*e*, with the exception that dipole electrodes 128 and dipole electrodes 140 each include a positive pole and negative pole formed on a same side of isolating plate 122 or isolating plate 132, respectively. Dipole electrodes 128 operate with dipole electrodes 140 as described hereinabove in reference to multi-electrode transducer 120*e* in FIG. 3*e*. In such embodiments, the positive and negative poles of dipole electrodes 128 and dipole electrodes 140 may be separated by some insulating material (not shown). In various embodiments, dipole electrodes 128 and dipole electrodes 140 may be formed on either the top or bottom sides of isolating plate 122 or isolating plate 132, respectively.

According to various embodiments, isolating plate 122 is the membrane of the MEMS acoustic transducer and isolating plate 132 is the backplate of the MEMS acoustic transducer in some embodiments. In other embodiments, isolating plate 122 is the backplate of the MEMS acoustic transducer and isolating plate 132 is the membrane of the MEMS acoustic transducer. In various embodiments, the membrane (either isolating plate 132 or isolating plate 122) may experience an attractive force for some separation distances and a repulsive force for other separation distances depending on the electric fields formed by dipole electrodes 140 and dipole electrodes 128.

FIGS. 3*a*, 3*b*, 3*c*, 3*d*, 3*e*, and 3*f* illustrate multi-electrode transducers 120*a*, 120*b*, 120*c*, 120*d*, 120*e*, and 120*f* according to various embodiments. The various electrodes depicted, such as dipole electrodes 126, dipole electrodes 128, dipole electrodes 130, dipole electrodes 134, and electrodes 136, may be included in embodiments with any number of dipole electrodes. That is, in the various figures, four or eight dipole electrodes, for example, are illustrated; however, any number of dipole electrodes or electrodes may be included on a conductive or isolating plate for a membrane or backplate in various embodiments. Similarly, in various other embodiments that include structures without a membrane or backplate, any number of dipole electrodes or electrodes may be included.

Figure 4A:
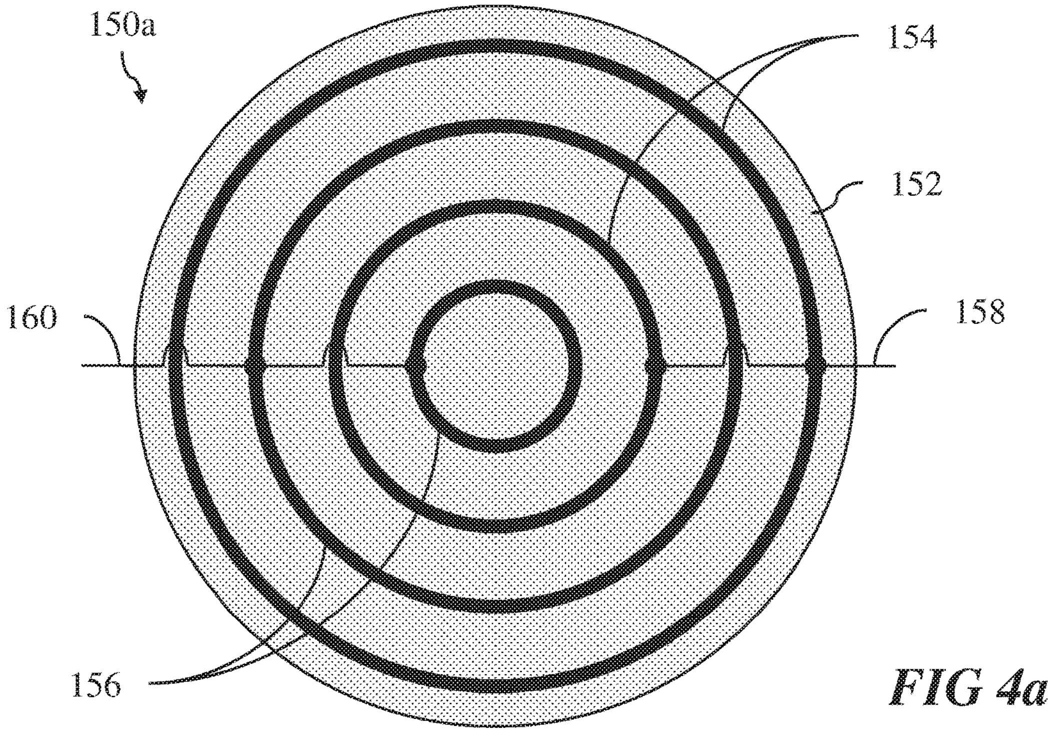
FIGS. 4*a*, 4*b*, 4*c*, and 4*d* illustrate top-view schematic diagrams of embodiment multi-electrode transducer plates.

FIGS. 4*a*, 4*b*, 4*c*, and 4*d* illustrate top-view schematic diagrams of embodiment multi-electrode transducer plates 150*a*, 150*b*, and 150*c*. FIG. 4*a* illustrates a top view of multi-electrode transducer plate 150*a*, which may be part of one implementation of multi-electrode transducer 120*c* described hereinabove in reference to FIG. 3*c*. According to various embodiments, multi-electrode transducer plate 150*a* includes first electrodes 154, second electrodes 156, isolating plate 152, connection 158, and connection 160. First electrodes 154 and second electrodes 156 are formed on a top or bottom surface of isolating plate 152 in a circular pattern. In such embodiments, isolating plate 152 may be a backplate or a membrane and may include an additional plate, such as an isolating plate or a conductive plate as described hereinabove in reference to FIGS. 3*a*-3*f*, formed beneath isolating plate 152. In other embodiments, isolating plate 152 is another shape, such as rectangular or oval. In various embodiments, first electrodes 154 and second electrodes 156 may be formed on a top or bottom surface of isolating plate 152 in an oval or rectangular pattern. The additional plate may have similar or identical structures as multi-electrode transducer plate 150*a* or may include a conductive plate for example. In various embodiments, isolating plate 152 is one implementation of isolating plate 122 and is an insulator. In alternative embodiments, isolating plate 152 may include a conductor, or conductors, with isolating layers formed on the top or bottom surfaces of the conductor, or conductors.

According to various embodiments, connection 158 couples first electrodes 154 to a first charge source and connection 160 couples second electrodes 156 to a second charge source. In such embodiments, adjacent electrodes of first electrodes 154 and second electrodes 156 form positive and negative poles of dipole electrodes. In one embodiment, as similarly illustrated in FIG. 3*c*, connection 158 provides charge for positive poles of each dipole electrode and connection 160 provides charge for negative poles of each dipole electrode. In various embodiments, connection 160 and connection 158 are formed opposite one another as shown. In other embodiments, connection 160 and connection 158 may be formed with any orientation and may be formed overlying one another.

Figure 4B:
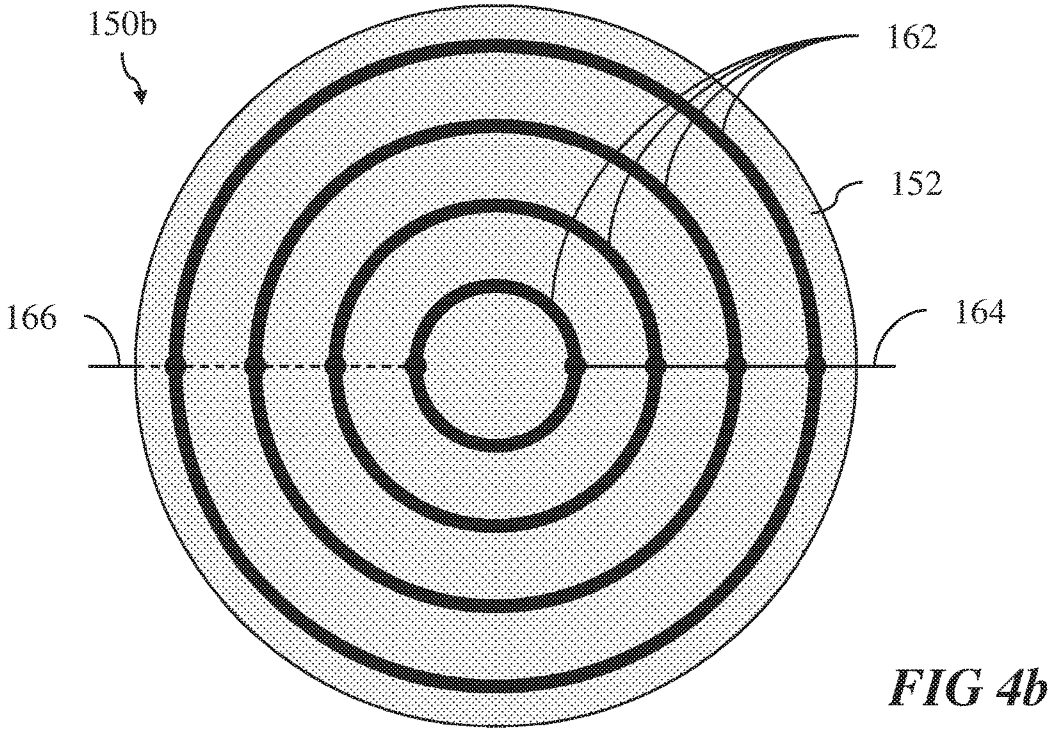

FIG. 4*b* illustrates a top view of multi-electrode transducer plate 150*b*, which may be part of one implementation of multi-electrode transducers 120*a*, 120*b*, 120*e*, or 120*f* described hereinabove in reference to FIGS. 3*a*, 3*b*, 3*e*, and 3*f*. According to various embodiments, multi-electrode transducer plate 150*b* includes electrodes 162, isolating plate 152, connection 166, and connection 166. Electrodes 162 are formed on a top surface of isolating plate 152 in a circular pattern. Connection 164 couples each of electrodes 162 to a common charge source.

In various embodiments, additional electrodes may be included beneath electrodes 162 or beneath isolation plate 152. In such embodiments, connection 166 is coupled to the additional electrodes. In one embodiment, as described hereinabove in reference to FIG. 3*a*, electrodes 162 coupled to connection 164 may form the positive poles on a top surface of isolating plate 152 and additional electrodes coupled to connection 166 may form the negative poles on a bottom surface of isolating plate 152 for dipole electrodes. In another embodiment, as described hereinabove in reference to FIG. 3*b*, electrodes 162 coupled to connection 164 may form the negative poles on the top surface of isolating plate 152 and additional electrodes coupled to connection 166 may form the positive poles beneath the negative poles on the top surface of isolating plate 152 for dipole electrodes.

According to various embodiments, as described in reference to FIGS. 3*a*, 3*b*, 3*e*, and 3*f*, an additional plate may be formed beneath isolating plate 152 in multi-electrode transducer plate 150*b*. The additional plate may include a conductive plate in some embodiments, as described in reference to FIGS. 3*a* and 3*b*. The additional plate may include an isolating plate in other embodiments, as described in reference to FIGS. 3*e* and 3*f*. In various embodiments, the additional plate may include similar or identical structures as multi-electrode transducer plate 150*b*. In various embodiments, connection 164 and connection 166 are formed opposite one another as shown. In other embodiments, connection 164 and connection 166 may be formed with any orientation and may be formed overlying one another.

Figure 4C:
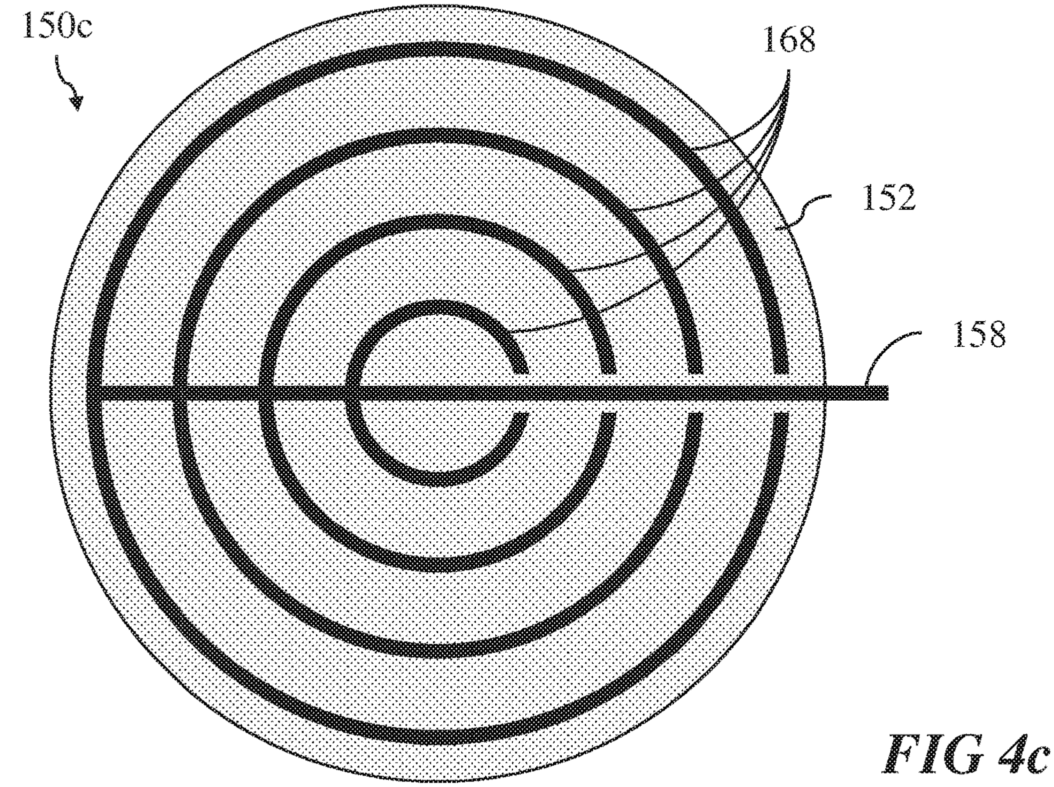

FIG. 4*c* illustrates a top view of multi-electrode transducer plate 150*c*, which may be part of one implementation of multi-electrode transducer 120*d* described hereinabove in reference to FIG. 3*d*. According to various embodiments, multi-electrode transducer plate 150*c* includes isolating plate 152, electrode 168, and connection 158. Electrode 168 includes circular electrode rings formed on isolating plate 152 with breaks or discontinuities near a straight portion extending radially as connection 158. In such embodiments, the structure of electrode 168 may cause charges to distribute around electrode 168 as described in reference to electrode 136 in FIG. 3*d*. An additional plate may be formed beneath isolating plate 152 in multi-electrode transducer plate 150*c*. The additional plate may include a conductive plate in some embodiments, as described in reference to FIG. 3*d*. In an alternative embodiment, the additional plate may include an isolating plate that may have patterned electrodes.

Figure 4D:
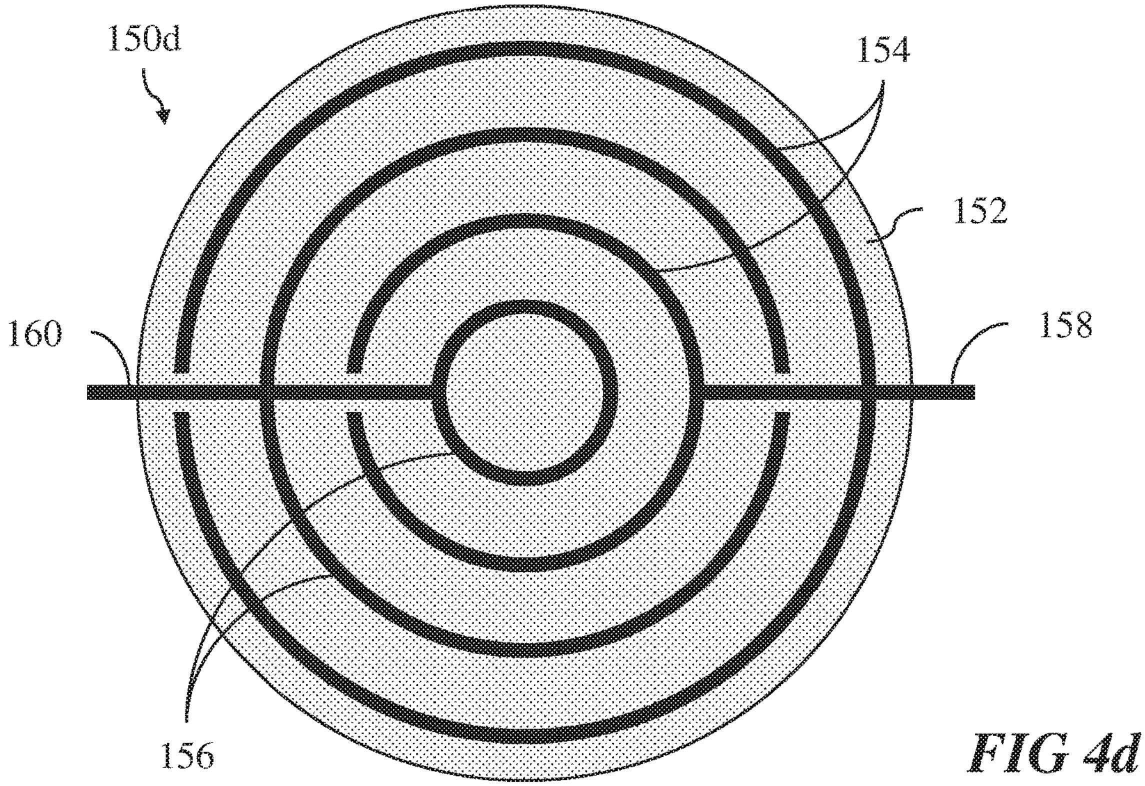

FIG. 4*d* illustrates a top view of multi-electrode transducer plate 150*d*, which may be part of one implementation of multi-electrode transducer 120*c* described hereinabove in reference to FIG. 3*c*. According to various embodiments, multi-electrode transducer plate 150*d* includes first electrodes 154, second electrodes 156, isolating plate 152, connection 158, and connection 160, as described hereinabove in reference to FIG. 4*a*. Multi-electrode transducer plate 150*d* is similar to multi-electrode transducer plate 150*a*, with the exception that first electrodes 154 and second electrodes 156 may include a gap, e.g., a break or discontinuity, at connection 160 and connection 158, respectively. In such embodiments, first electrodes 154, second electrodes 156, connection 158, and connection 160 may be patterned using a single mask. In other embodiments, one or more additional layers may be formed at the gap or gaps in first electrodes 154 or second electrodes 156.

Figure 5:
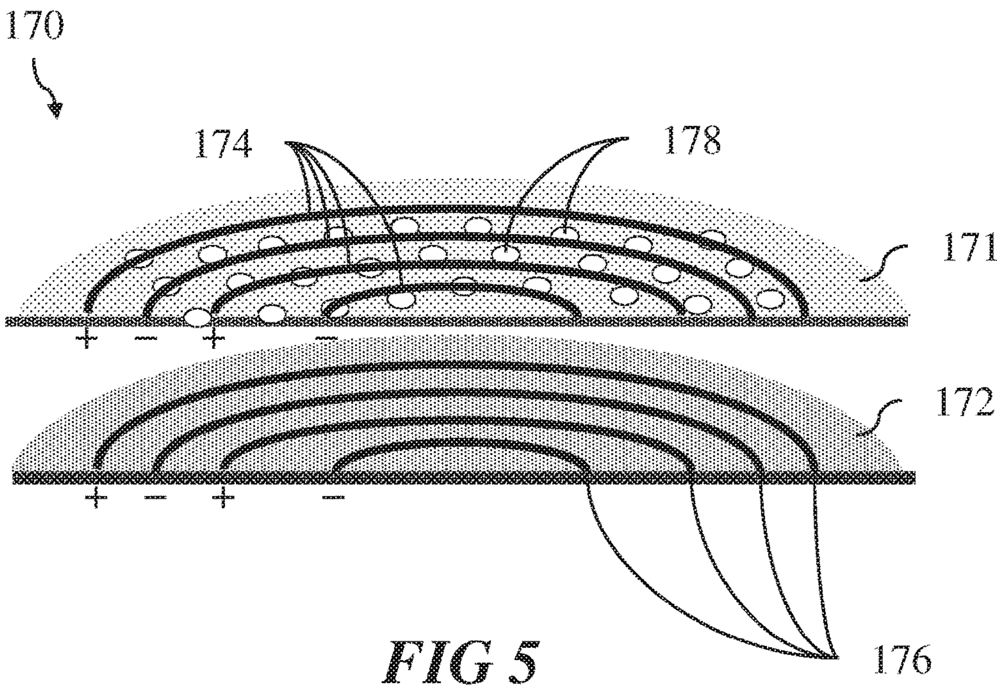
FIG. 5 illustrates a perspective-view cross-section diagram of an embodiment multi-electrode transducer.

FIG. 5 illustrates a perspective-view cross-section diagram of an embodiment multi-electrode transducer 170, which may be one implementation of multi-electrode transducer 120*c* described hereinabove in reference to FIG. 3*c*. According to various embodiments, multi-electrode transducer 170 includes top plate 171, bottom plate 172, electrodes 174, and electrodes 176. Top plate 171 may be a backplate for an acoustic MEMS transducer and bottom plate 172 may be a membrane of the acoustic MEMS transducer. Top plate 171 is perforated with perforations 178 in some embodiments. As shown and similarly described hereinabove in reference to multi-electrode transducer 120*c* in FIG. 3*c*, electrodes 174 include alternating charge polarities and electrodes 176 also include alternating charge polarities.

Top plate 171 and bottom plate 172 may be insulators with patterned electrodes 174 and 176, respectively. In other embodiments, top plate 171 and bottom plate 172 may be conductors with insulating layers formed on top or bottom surfaces of top plate 171 or bottom plate 172. Further, electrodes 174 and 176 may be formed on top or bottom surfaces of top plate 171 or bottom plate 172. In other embodiments, top plate 171 or bottom plate 172 may include any type of electrode configuration described hereinabove in reference to FIGS. 3*a*-3*f* and 4*a*-4*d*.

In reference to FIGS. 3*a*-3*f*, 4*a*-4*d*, and 5, description is made with reference to directions such as below or above, top or bottom. One of ordinary skill in the art will recognize that these configurations may be swapped in some embodiments. Further, the various electrode and plate configurations may be arranged as a membrane, backplate, or both in some embodiments for a MEMS acoustic transducer. The description and figures depict general electrode configurations diagrammatically without showing specific detail as to semiconductor structures for implementing the depicted electrode configurations. Various embodiment semiconductor structures for implementing the various embodiment electrode configurations are described further herein below in reference to the other figures.

FIGS. 6*a*, 6*b*, 6*c*, 6*d*, 6*e*, 6*f*, 6*g*, 6*h*, 6*i*, 6*j*, 6*k*, and 6*l* illustrate cross sections of embodiment multi-electrode elements 200*a*, 200*b*, 200*c*, 200*d*, 200*e*, 200*f*, 200*g*, and 200*h*. According to various embodiments, multi-electrode elements 200*a*-200*h* include device layers and structures for forming various electrodes and dipole electrodes for embodiment multi-electrode transducers as described hereinabove in reference to the other figures. FIGS. 6*a*-6*l* illustrate portions of various embodiment electrodes and dipole electrodes. The same device layers and patterning may be applied to form any number of electrodes for embodiment multi-electrode transducers.

Figure 6A:
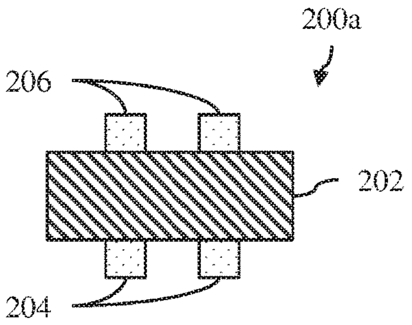
FIGS. 6*a*, 6*b*, 6*c*, 6*d*, 6*e*, 6*f*, 6*g*, 6*h*, 6*i*, 6*j*, 6*k*, and 6*l* illustrate cross sections of embodiment multi-electrode elements.

FIG. 6*a* illustrates multi-electrode element 200*a* including insulating layer 202, first electrodes 204, and second electrodes 206. In various embodiments, insulating layer 202 is formed of silicon nitride or silicon dioxide. In further embodiments, insulating layer 202 may be formed of any type of oxide or nitride. Insulating layer 202 may be any type of insulator suitable for fabrication and operation with embodiment multi-electrode transducers, such as a polymer in alternative embodiments.

First electrodes 204 may be formed as a common conductive layer and patterned. First electrodes 204 are formed of polysilicon in one embodiment. First electrodes 204 are formed of metal in other embodiments. In such embodiments, first electrodes 204 are formed of aluminum, silver, or gold. In other embodiments, first electrodes 204 are formed of any conductor suitable for fabrication and operation with embodiment multi-electrode transducers, such as other metals or doped semiconductors.

Similar to first electrodes 204, second electrodes 206 may be formed as a common conductive layer and patterned. Second electrodes 206 are formed of polysilicon in one embodiment. Second electrodes 206 are formed of metal in other embodiments. In such embodiments, second electrodes 206 are formed of aluminum, silver, or gold. In other embodiments, second electrodes 206 are formed of any conductor suitable for fabrication and operation with embodiment multi-electrode transducers, such as other metals or doped semiconductors. In some other embodiments, electrodes, such as first electrode 204 or second electrode 206, may be included only on the top surface or only on the bottom surface of the supporting layer, such as insulating layer 202, instead of on both the top and bottom surfaces as shown.

Figure 6B:
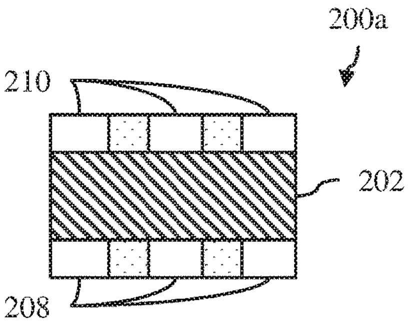

FIG. 6*b* illustrates multi-electrode element 200*a* at another cross-section including insulating layer 202, first electrodes 204, second electrode 206, first electrical connections 208, and second electrical connections 210. According to various embodiments, first electrical connections 208 and first electrodes 204 may be formed as a common conductive layer and patterned. Thus, first electrical connections 208 may be any of the materials described in reference to first electrode 204. Similarly, second electrical connections 210 and second electrodes 206 may be formed as a common conductive layer and patterned. Thus, second electrical connections 210 may be any of the materials described in reference to second electrode 206. First electrical connections 208 and second electrical connections 210 form connections between the various electrodes, such as first electrodes 204 or second electrodes 206, and may form connections 164 or 166 as described hereinabove in reference to FIG. 4*b*, for example.

Figure 6C:
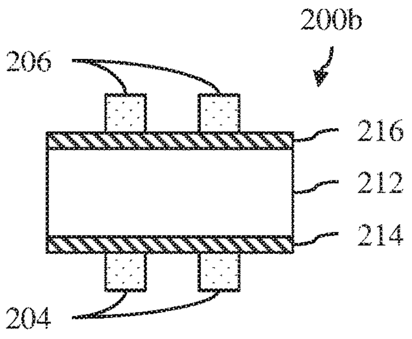

FIG. 6*c* illustrates multi-electrode element 200*b* including conductive layer 212, bottom insulating layer 214, top insulating layer 216, first electrodes 204, and second electrodes 206. In various embodiments, bottom insulating layer 214 and top insulating layer 216 are formed of silicon nitride or silicon dioxide. In further embodiments, bottom insulating layer 214 and top insulating layer 216 may be formed of any type of oxide or nitride. Bottom insulating layer 214 and top insulating layer 216 may be formed of any type of insulator suitable for fabrication and operation with embodiment multi-electrode transducers, such as a polymer in alternative embodiments. First electrodes 204 and second electrodes 206 are formed as described hereinabove in reference to FIGS. 6*a* and 6*b*. In various embodiments, conductive layer 212 may be patterned with various patterns and structures in order to shape the electric field formed around multi-electrode elements. In some specific embodiments, conductive layer 212 may shield the electric field from crossing conductive layer 212 by terminating the electric field at conductive layer 212.

Figure 6D:
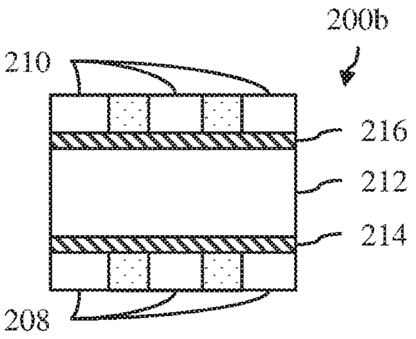

FIG. 6*d* illustrates multi-electrode element 200*b* at another cross-section including conductive layer 212, bottom insulating layer 214, top insulating layer 216, first electrodes 204, second electrodes 206, first electrical connections 208, and second electrical connections 210. According to various embodiments, first electrical connections 208 and second electrical connections 210 are formed as described hereinabove in reference to FIGS. 6*a* and 6*b*. First electrical connections 208 and second electrical connections 210 form connections between the various electrodes, such as first electrodes 204 or second electrodes 206, and may form connections 164 or 166 as described hereinabove in reference to FIG. 4*b*, for example.

Figure 6E:
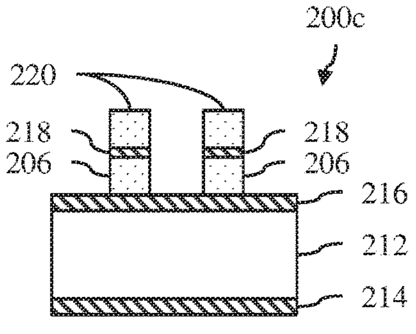

FIG. 6*e* illustrates multi-electrode element 200*c* including conductive layer 212, bottom insulating layer 214, top insulating layer 216, second electrodes 206, electrode insulating layer 218, and third electrodes 220. In various embodiments, conductive layer 212, bottom insulating layer 214, top insulating layer 216, and second electrodes 206 are formed as described hereinabove in reference to FIGS. 6*a*, 6*b*, 6*c*, and 6*d*. Electrode insulating layer 218 is formed as a layer and patterned on top of second electrodes 206. Electrode insulating layer 218 is formed of silicon nitride or silicon dioxide. In further embodiments, electrode insulating layer 218 may be formed of any type of oxide or nitride. Electrode insulating layer 218 may be formed of any type of insulator suitable for fabrication and operation with embodiment multi-electrode transducers, such as a polymer in alternative embodiments.

Third electrodes 220 may be formed as a common conductive layer and patterned on top of electrode insulating layer 218. Third electrodes 220 are formed of polysilicon in one embodiment. Third electrodes 220 are formed of metal in other embodiments. In such embodiments, third electrodes 220 are formed of aluminum, silver, or gold. In other embodiments, third electrodes 220 are formed of any conductor suitable for fabrication and operation with embodiment multi-electrode transducers, such as other metals or doped semiconductors. In some embodiments, bottom insulating layer 214 may be omitted.

Figure 6F:
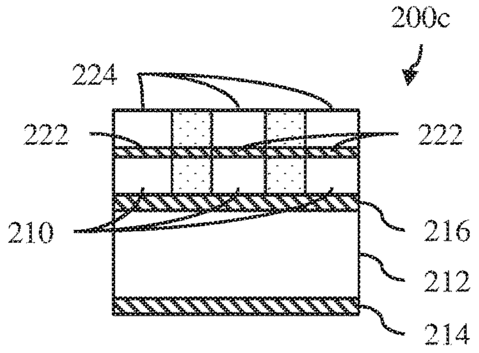

FIG. 6*f* illustrates multi-electrode element 200*c* at another cross-section including conductive layer 212, bottom insulating layer 214, top insulating layer 216, second electrodes 206, second electrical connections 210, electrode insulating layer 218, connection insulating layer 222, third electrodes 220, and third electrical connections 224. According to various embodiments, second electrical connections 210 are formed as described hereinabove in reference to FIGS. 6*a* and 6*b*. Third electrical connections 224 may be formed as a common conductive layer with third electrodes 220 and patterned. Thus, third electrical connections 224 may be any of the materials described in reference to third electrode 220. Connection insulating layer 222 may be formed as a common insulating layer with electrode insulating layer 218 and patterned. Thus, connection insulating layer 222 may be any of the materials described in reference to electrode insulating layer 218.

According to various embodiments, second electrical connections 210 and third electrical connections 224 form connections between the various electrodes, such as second electrodes 206 or third electrodes 220, and may form connections 164 or 166 as described hereinabove in reference to FIG. 4*b*, for example. Connection insulating layer 222 provides insulation between second electrical connections 210 and third electrical connections 224. In some embodiments, bottom insulating layer 214 may be omitted.

Figure 6G:
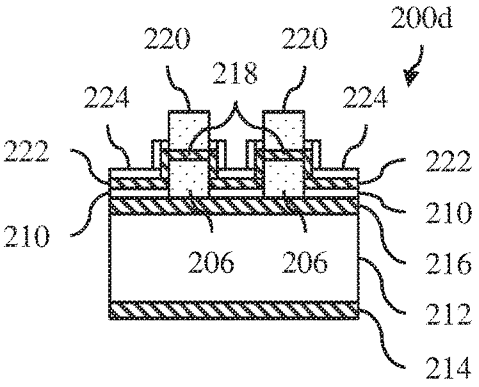

FIG. 6*g* illustrates multi-electrode element 200*d* at a cross-section including conductive layer 212, bottom insulating layer 214, top insulating layer 216, second electrodes 206, second electrical connections 210, electrode insulating layer 218, connection insulating layer 222, third electrodes 220, and third electrical connections 224. Multi-electrode element 200*d* is similar to multi-electrode element 200*c* as described hereinabove in reference to FIG. 6*f* with the exception that second electrical connections 210 and third electrical connections 224 have been thinned compared to second electrodes 206 and third electrodes 220. In some embodiments, thinning the connection layers may require an additional photolithography and mask sequence. Other than the thinning step, conductive layer 212, bottom insulating layer 214, top insulating layer 216, second electrodes 206, second electrical connections 210, electrode insulating layer 218, connection insulating layer 222, third electrodes 220, and third electrical connections 224 are formed as described hereinabove in reference to FIGS. 6*a*-6*f*. In some embodiments, bottom insulating layer 214 may be omitted.

Figure 6H:
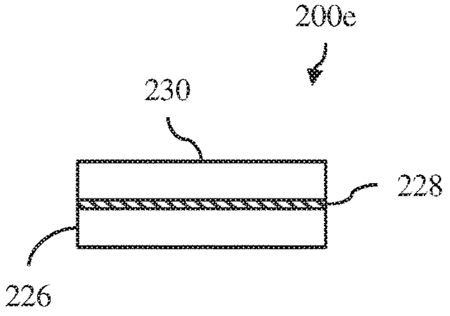

FIG. 6*h* illustrates multi-electrode element 200*e* including conductive layer 226, insulating layer 228, and conductive layer 230. According to various embodiments, multi-electrode element 200*e* is an alternative embodiment that includes thick top and bottom electrodes formed by conductive layer 226 and conductive layer 230 with thinner insulating layer 228 formed between the conductive layer 226 and conductive layer 230. In such embodiments, conductive layer 226, insulating layer 228, and conductive layer 230 may form a backplate or a membrane. Further, conductive layer 226 and conductive layer 230 may be patterned to form electrical connections or electrodes on various portions of the membrane or backplate.

Conductive layer 226 may be formed as a common conductive layer and patterned. Conductive layer 226 is formed of polysilicon in one embodiment. Conductive layer 226 is formed of metal in other embodiments. In such embodiments, conductive layer 226 is formed of aluminum, silver, or gold. In other embodiments, conductive layer 226 is formed of any conductor suitable for fabrication and operation with embodiment multi-electrode transducers, such as other metals or doped semiconductors.

Similar to conductive layer 226, conductive layer 230 may be formed as a common conductive layer and patterned. Conductive layer 230 is formed of polysilicon in one embodiment. Conductive layer 230 is formed of metal in other embodiments. In such embodiments, conductive layer 230 is formed of aluminum, silver, or gold. In other embodiments, conductive layer 230 is formed of any conductor suitable for fabrication and operation with embodiment multi-electrode transducers, such as other metals or doped semiconductors.

Insulating layer 228 is formed as a layer and patterned between conductive layer 226 and conductive layer 230. Insulating layer 228 is formed of silicon nitride or silicon dioxide. In further embodiments, insulating layer 228 may be formed of any type of oxide or nitride. Insulating layer 228 may be formed of any type of insulator suitable for fabrication and operation with embodiment multi-electrode transducers, such as a polymer in alternative embodiments.

Figure 6I:
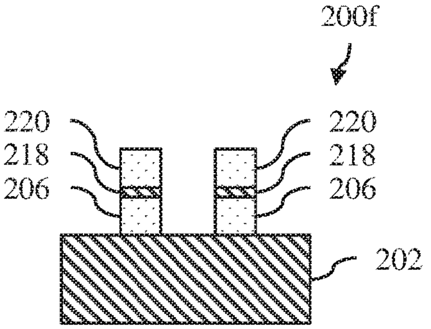

FIG. 6*i* illustrates multi-electrode element 200*f* including insulating layer 202, second electrodes 206, electrode insulating layer 218, and third electrodes 220. In various embodiments, insulating layer 202, second electrodes 206, electrode insulating layer 218, and third electrodes 220 are formed as described hereinabove in reference to FIGS. 6*a*-6*h*. Second electrodes 206, electrode insulating layer 218, and third electrodes 220 are patterned as described in reference to FIG. 6*e*.

Figure 6J:
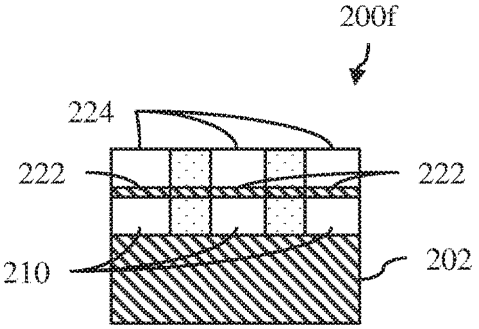

FIG. 6*j* illustrates multi-electrode element 200*f* at another cross-section including insulating layer 202, second electrodes 206, second electrical connections 210, electrode insulating layer 218, connection insulating layer 222, third electrodes 220, and third electrical connections 224. According to various embodiments, second electrical connections 210, third electrical connections 224, and connection insulating layer 222 are formed as described hereinabove in reference to FIGS. 6*a*-6*h*.

Figure 6K:
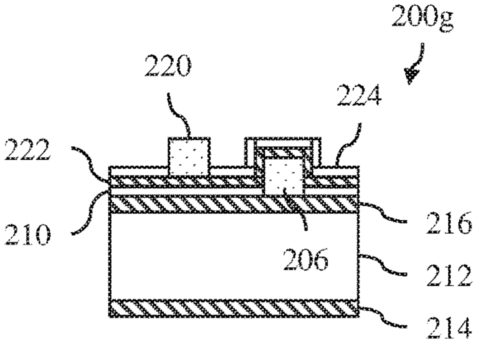
Figure 6L:
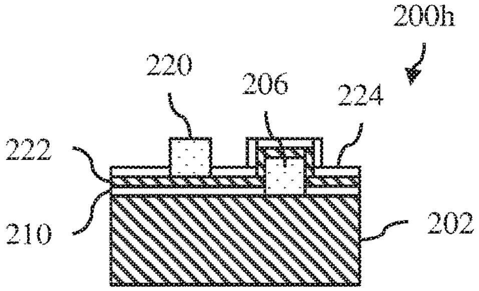

FIG. 6*k* and FIG. 6*l* illustrate multi-electrode elements 200*g* and 200*h* at cross-sections showing electrical connections between electrodes according to two implementations of multi-electrode transducer plate 150*a* as described hereinabove in reference to FIG. 4*a*. According to various embodiments, second electrodes 206 and third electrodes 220 may be arranged to alternate polarity, such as described hereinabove in reference to FIGS. 3*c* and 4*a*. Thus, FIGS. 6*k* and 6*l* depict electrical connections provided for second electrodes 206 and third electrodes 220 with alternating polarity. In such embodiments, insulating layer 202, second electrodes 206, third electrodes 220, conductive layer 212, bottom insulating layer 214, top insulating layer 216, second electrical connections 210, connection insulating layer 222, and third electrical connections 224 are formed as described hereinabove in reference to FIGS. 6*a*-6*j*. In such embodiments, second electrical connections 210 and third electrical connections 224 may be thinner or may have a same thickness as second electrodes 206 or third electrodes 220, as described hereinabove in reference to FIGS. 6*f* and 6*g*, for example. In some embodiments, bottom insulating layer 214 may be omitted.

In various embodiments as described hereinabove in reference to FIGS. 6*a*-6*l*, the various electrodes may be formed on top or bottom surfaces of the respective supporting surface.

FIGS. 7*a*, 7*b*, 7*c*, 7*d*, and 7*e* illustrate cross sections of embodiment MEMS acoustic transducers 231*a*, 231*b*, 231*c*, 231*d*, and 231*e*. FIGS. 7*a*, 7*b*, 7*c*, 7*d*, and 7*e* describe MEMS acoustic transducers according to specific embodiments for backplates and membranes. In further embodiments, any of the transducer plate and electrode embodiments described hereinabove in reference to FIGS. 3*a*-3*f*, 4*a*-4*d*, 5, and 6*a*-6*l* may be included as either backplate, membrane, or both in the embodiments described in reference to FIGS. 7*a*, 7*b*, 7*c*, 7*d*, and 7*e*. Those skilled in the art will readily appreciate that the structures and methods described herein in reference to the various embodiments may be combined or incorporated in numerous types of MEMS acoustic transducers, as well as other types of transducers.

Figure 7A:
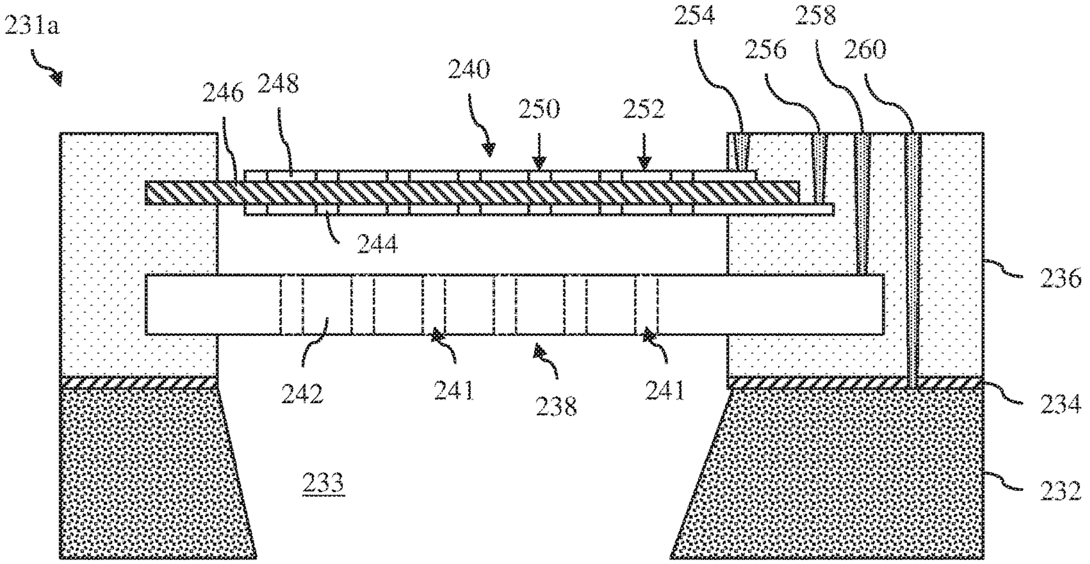
FIGS. 7*a*, 7*b*, 7*c*, 7*d*, and 7*e* illustrate cross sections of embodiment MEMS acoustic transducers.

FIG. 7*a* illustrates MEMS acoustic transducer 231*a* including a single backplate 238 and membrane 240. According to various embodiments, MEMS acoustic transducer 231*a* includes substrate 232, isolation 234, structural layer 236, backplate 238, membrane 240, metallization 254, metallization 256, metallization 258, and metallization 260. Substrate 232 includes cavity 233 formed below released portions of membrane 240 and backplate 238.

In various embodiments, membrane 240 is formed of conductive layer 244, insulating layer 246, and conductive layer 248. In various embodiments, insulating layer 246 is formed of silicon nitride or silicon dioxide. In further embodiments, insulating layer 246 may be formed of any type of oxide or nitride. Insulating layer 246 may be any type of insulator suitable for fabrication and operation with embodiment multi-electrode transducers, such as a polymer in alternative embodiments.

Conductive layer 244 and conductive layer 248 may be formed as conductive layers on the top and bottom surfaces of insulating layer 246, respectively. Further, conductive layer 244 and conductive layer 248 are patterned to form dipole electrodes 250 and electrical connections 252. Conductive layer 244 and conductive layer 248 are formed of polysilicon in one embodiment. Conductive layer 244 and conductive layer 248 are formed of metal in other embodiments. In such embodiments, conductive layer 244 and conductive layer 248 are formed of aluminum, silver, or gold. In other embodiments, conductive layer 244 and conductive layer 248 are formed of any conductor suitable for fabrication and operation with embodiment multi-electrode transducers, such as other metals or doped semiconductors.

In various embodiments, backplate 238 and membrane 240 are supported by structural layer 236, which is formed of an insulating material. Structural layer 236 is formed of tetraethyl orthosilicate (TEOS) oxide in one embodiment. In other embodiments, structural layer 236 may be formed of oxides or nitrides. In alternative embodiments, structural layer 236 is formed of a polymer. Isolation 234 is formed between substrate 232 and structural layer 236. Isolation 234 is a nitride, such as silicon nitride, in some embodiments. In other embodiments, isolation 234 is any type of insulating etch resistant material. For example, substrate 232 may undergo a backside etch through the whole substrate where isolation 234 is used as an etch stop. In such embodiments, isolation 234 is a material that is selectively etched much slower than the material of substrate 232.

According to various embodiments, substrate 232 is silicon. Substrate 232 may also be any type of semiconductor. In further embodiments, substrate 232 may be a polymer substrate or a laminate substrate.

In various embodiments, backplate 238 is formed of conductive layer 242 and includes perforations 241. Backplate 238 may be a rigid backplate structure that remains substantially un-deflected while membrane 240 deflects in relation to acoustic signals. In various embodiments, backplate 238 has a greater thickness than membrane 240. Conductive layer 242 is polysilicon in some embodiments. In other embodiments, conductive layer 242 is any type of semiconductor, such as doped semiconductor layer. In still further embodiments, conductive layer 242 is formed of a metal, such as aluminum, silver, gold, or platinum, for example.

According to various embodiments, metallization 254 is formed in a via in structural layer 236 and forms an electrical contact with conductive layer 248. Similarly, metallization 256 is formed in a via in structural layer 236 and forms an electrical contact with conductive layer 244, metallization 258 is formed in a via in structural layer 236 and forms an electrical contact with conductive layer 242, and metallization is formed in a via in structural layer 236 and forms an electrical contact with substrate 232. Metallization 254, metallization 256, metallization 258, and metallization 260 are formed of aluminum in some embodiments. In other embodiments, metallization 254, metallization 256, metallization 258, and metallization 260 are formed of any type of metal suitable for the fabrication process and other materials used in MEMS acoustic transducer 231*a*.

In various embodiments, dipole electrodes 250 operate with backplate 238 as described hereinabove in reference to FIGS. 2*a*, 3*a*, 3*b*, and 4*b* for example. In additional embodiments, backplate 238 and membrane 240 may flipped such that backplate 238 is above and membrane 240 is below and closer to cavity 233. In various embodiments, a sound port may be included below cavity 233. In other embodiments, a sound port may be included above MEMS acoustic transducer 231*a*.

Membrane 240 is depicted at a cross-section showing electrical connections 252, as similarly described hereinabove in reference to FIG. 6*b*, however, sections of membrane 240 also include patterned electrodes as described hereinabove in reference to FIGS. 4*b* and 6*a*, for example.

In various embodiments, MEMS acoustic transducer 231*a* is a MEMS microphone. In other embodiments, MEMS acoustic transducer 231*a* is a MEMS microspeaker. In such embodiments, the size of the membrane and the separation distance between backplate 238 and membrane 240 may be larger for the MEMS microspeaker than for the MEMS microphone.

Figure 7B:
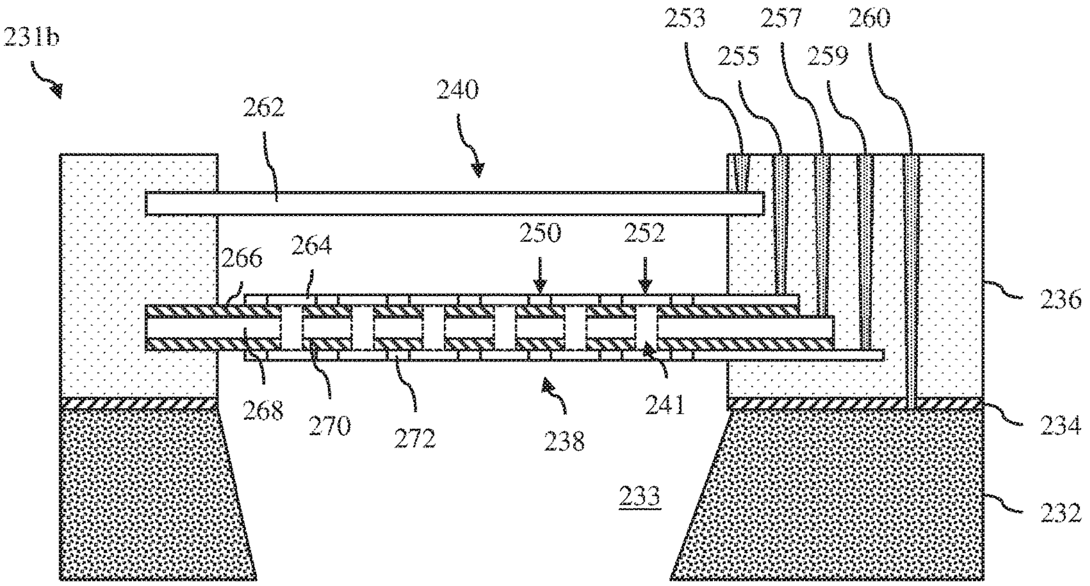

FIG. 7*b* illustrates MEMS acoustic transducer 231*b* including a single backplate 238 and membrane 240. According to various embodiments, MEMS acoustic transducer 231*b* includes substrate 232, isolation 234, structural layer 236, backplate 238, membrane 240, metallization 253, metallization 255, metallization 257, metallization 259, and metallization 260. MEMS acoustic transducer 231*b* is similar to MEMS acoustic transducer 231*a*, with the exception that backplate 238 is a multilayer semiconductor structure that includes dipole electrodes 250 and membrane 240 does not include dipole electrodes.

In various embodiments, membrane 240 is formed of conductive layer 262. Conductive layer 262 is polysilicon in some embodiments. In other embodiments, conductive layer 262 is any type of semiconductor, such as doped semiconductor layer. In still further embodiments, conductive layer 262 is formed of a metal, such as aluminum, silver, gold, or platinum, for example.

According to various embodiments, backplate 238 includes a five layer semiconductor stack including conductive layer 264, insulating layer 266, conductive layer 268, insulating layer 270, and conductive layer 272. Backplate 238 includes perforations 241. In various embodiments, dipole electrodes 250 are formed from conductive layer 264 and interconnected with electrical connections 252, which are also formed from conductive layer 264.

In various embodiments, conductive layer 268 is polysilicon in some embodiments. In other embodiments, conductive layer 268 is any type of semiconductor, such as doped semiconductor layer. In still further embodiments, conductive layer 268 is formed of a metal, such as aluminum, silver, gold, or platinum, for example. In various embodiments, conductive layer 268, insulating layer 266, and insulating layer 270 are combined into a single insulating layer with a similar combination of layers as membrane 240, for example.

In various embodiments, insulating layer 266 and insulating layer 270 are formed on the top surface and bottom surface of conductive layer 268, respectively. Insulating layer 266 and insulating layer 270 are formed of silicon nitride or silicon dioxide. In further embodiments, insulating layer 266 and insulating layer 270 may be formed of any type of oxide or nitride. Insulating layer 266 and insulating layer 270 may be any type of insulator suitable for fabrication and operation with embodiment multi-electrode transducers, such as a polymer in alternative embodiments.

Conductive layer 264 and conductive layer 272 may be formed as conductive layers on the top and bottom surfaces of insulating layer 266 and insulating layer 270, respectively. Further, conductive layer 264 and conductive layer 272 are patterned to form dipole electrodes 250 and electrical connections 252. Conductive layer 264 and conductive layer 272 are formed of polysilicon in one embodiment. Conductive layer 264 and conductive layer 272 are formed of metal in other embodiments. In such embodiments, conductive layer 264 and conductive layer 272 are formed of aluminum, silver, or gold. In other embodiments, conductive layer 264 and conductive layer 272 are formed of any conductor suitable for fabrication and operation with embodiment multi-electrode transducers, such as other metals or doped semiconductors.

Backplate 238 is depicted at a cross-section showing electrical connections 252, as similarly described hereinabove in reference to FIG. 6*d*, however, sections of backplate 238 also include patterned electrodes as described hereinabove in reference to FIGS. 4*b* and 6*c*, for example.

Metallization 253, metallization 255, metallization 257, and metallization 259 may be formed as described hereinabove in reference to metallization 254, metallization 256, metallization 258, and metallization 260 in FIG. 6*a*. Metallization 253 is formed in a via in structural layer 236 and forms an electrical contact with conductive layer 262, metallization 255 is formed in a via in structural layer 236 and forms an electrical contact with conductive layer 264, metallization 257 is formed in a via in structural layer 236 and forms an electrical contact with conductive layer 268, and metallization 259 is formed in a via in structural layer 236 and forms an electrical contact with 272.

Figure 7C:
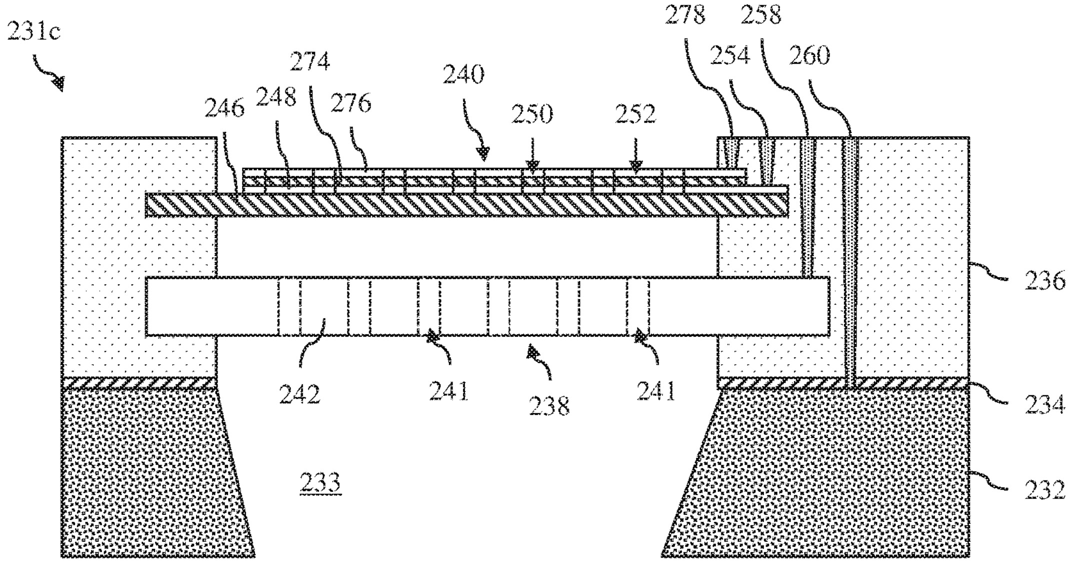

FIG. 7*c* illustrates MEMS acoustic transducer 231*c* including a single backplate 238 and membrane 240. According to various embodiments, MEMS acoustic transducer 231*c* includes substrate 232, isolation 234, structural layer 236, backplate 238, membrane 240, metallization 254, metallization 258, metallization 260, and metallization 278. MEMS acoustic transducer 231C is similar to MEMS acoustic transducer 231*a*, with the exception that membrane 240 includes both poles of dipole electrodes 250 formed on a same surface. In such embodiments, dipole electrodes 250 may be formed fully on the top surface or fully on the bottom surface of insulating layer 246.

In various embodiments, membrane 240 includes insulating layer 246, conductive layer 248, insulating layer 274, and conductive layer 276. Insulating layer 246 and conductive layer 248 are formed as described hereinabove in reference to FIG. 7*c*. Insulating layer 274 is formed on a top surface of conductive layer 248. Further, conductive layer 276 is formed on a top surface of insulating layer 274. Insulating layer 274 is formed of silicon nitride or silicon dioxide. In further embodiments, insulating layer 274 may be formed of any type of oxide or nitride. Insulating layer 274 may be any type of insulator suitable for fabrication and operation with embodiment multi-electrode transducers, such as a polymer in alternative embodiments.

Conductive layer 248 and conductive layer 276 are patterned to form dipole electrodes 250 and electrical connections 252. Conductive layer 276 is formed of polysilicon in one embodiment. Conductive layer 276 is formed of metal in other embodiments. In such embodiments, conductive layer 276 is formed of aluminum, silver, or gold. In other embodiments, conductive layer 276 is formed of any conductor suitable for fabrication and operation with embodiment multi-electrode transducers, such as other metals or doped semiconductors.

Metallization 278 may be formed as described hereinabove in reference to metallization 254, metallization 256, metallization 258, and metallization 260 in FIG. 6*a*. Metallization 278 is formed in a via in structural layer 236 and forms an electrical contact with conductive layer 276.

Membrane 240 is depicted at a cross-section showing electrical connections 252, as similarly described hereinabove in reference to FIG. 6*j*, however, sections of membrane 240 also include patterned electrodes as described hereinabove in reference to FIGS. 4*b* and 6*i*, for example.

Figure 7D:
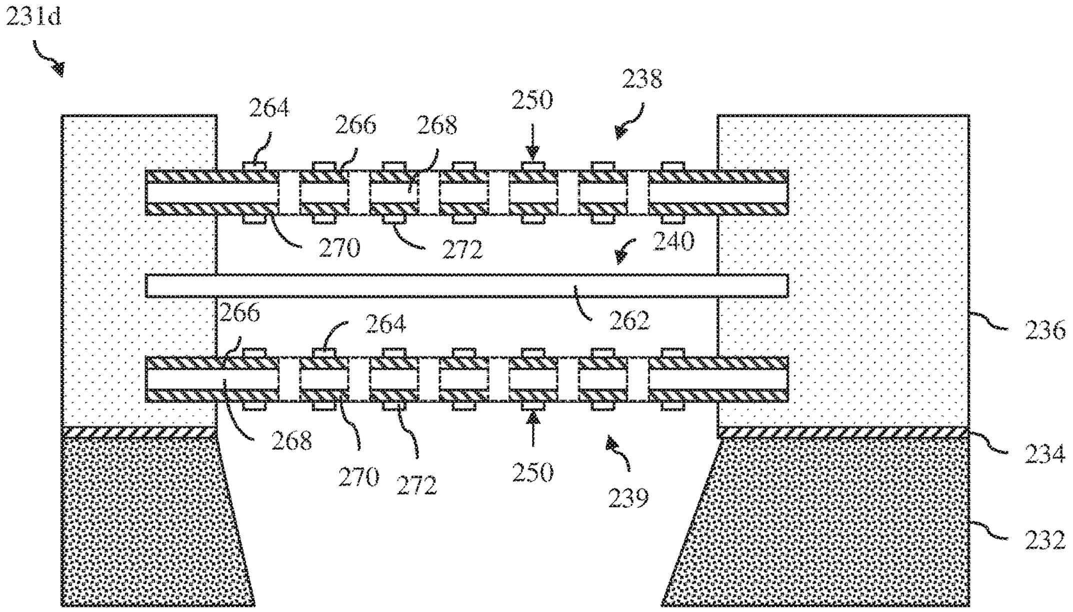

FIG. 7*d* illustrates MEMS acoustic transducer 231*d* including two backplates, backplate 238 and backplate 239, and membrane 240. According to various embodiments, MEMS acoustic transducer 231*d* includes substrate 232, isolation 234, structural layer 236, backplate 238, backplate 239, and membrane 240. MEMS acoustic transducer 231*d* is similar to MEMS acoustic transducer 231*b*, with the addition of second backplate 239.

In order to improve clarity, FIG. 7*d* illustrates MEMS acoustic transducer 231*d* at a cross-section that does not show electrical connections 252 or metallization for forming electrical contacts with conductive layer 248, conductive layer 268, or conductive layer 244 of backplate 238; conductive layer 262 of membrane 240; or conductive layer 248, conductive layer 268, or conductive layer 244 of backplate 239. However, such electrical connections 252 and metallization is included in various embodiments. For example, FIG. 7*d* illustrates MEMS acoustic transducer 231*d* with backplates 238 and 239 having semiconductor stacks as similarly described hereinabove in reference to FIG. 6*c*, however, sections of backplates 238 and 239 also include patterned electrodes as described hereinabove in reference to FIGS. 4*b* and 6*d*.

Backplate 238 and backplate 239 are illustrated with identical numerals for identification of the various structures and layers. Thus, the description provided hereinabove of the various structures and layers in reference to backplate 238 also applies to the commonly numbered layers and structures of backplate 239. However, one of ordinary skill in the art will recognize that the various layers, for example, of backplate 238 and backplate 239 are not the same layer and may be formed and patterned separately in various embodiments.

Figure 7E:
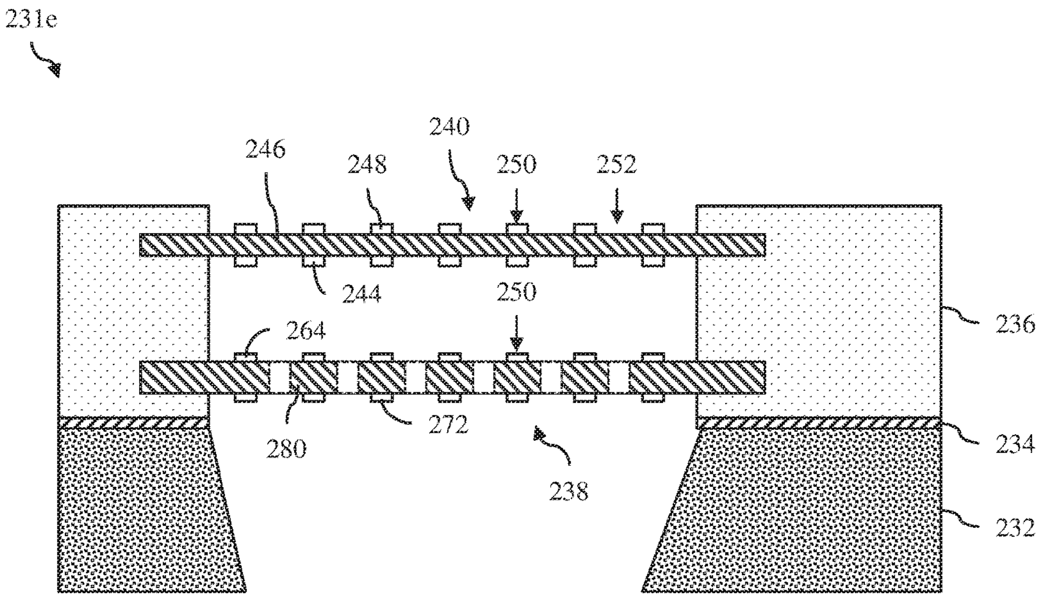

FIG. 7*e* illustrates MEMS acoustic transducer 231*e* including backplate 239 and membrane 240. According to various embodiments, MEMS acoustic transducer 231*e* includes substrate 232, isolation 234, structural layer 236, backplate 238, and membrane 240. MEMS acoustic transducer 231*e* is similar to MEMS acoustic transducer 231*a*, with patterned electrodes on both backplate 239 and membrane 240.

In order to improve clarity, FIG. 7*e* illustrates MEMS acoustic transducer 231*e* at a cross-section that does not show electrical connections 252 or metallization for forming electrical contacts with conductive layer 248, conductive layer 244, conductive layer 264; or conductive layer 272. However, such electrical connections 252 and metallization is included in various embodiments. For example, FIG. 7*e* illustrates MEMS acoustic transducer 231*e* with membrane 240 and backplate 238 having semiconductor stacks as similarly described hereinabove in reference to FIG. 6*a*, however, sections of membrane 240 and backplates 238 also include patterned electrodes as described hereinabove in reference to FIGS. 4*b* and 6*b*.

Membrane 240 is illustrated with identical numerals for identification of the various structures and layers. Thus, the description provided hereinabove of the various structures and layers in reference to membrane 240 also applies to the commonly numbered layers and structures. Similarly, backplate 238 is illustrated with identical numerals for identification of the various structures and layers, where insulating layer 280 replaces insulating layer 266, conductive layer 268, and insulating layer 270. In various embodiments, insulating layer 280 may include any of the features of insulating layer 246 or insulating layer 266 and insulating layer 270, as described hereinabove. In particular embodiments, insulating layer 280 is thicker than insulating layer 246. For the other elements of backplate 238, the description provided hereinabove of the various structures and layers in reference to backplate 238 also applies to the commonly numbered layers and structures.

The embodiments described in reference to FIGS. 7*a*, 7*b*, 7*c*, 7*d*, and 7*e* may be modified to include any of the embodiment electrode structures described hereinabove in reference to FIGS. 3*a*-3*f*, 4*a*-4*d*, 5, and 6*a*-6*l*. In various such embodiments, both the membrane and the backplate, or backplates in the case of a dual-backplate structure, may include any of the embodiment electrode structures described hereinabove in reference to FIGS. 3*a*-3*f*, 4*a*-4*d*, 5, and 6*a*-6*l*.

Figure 8:
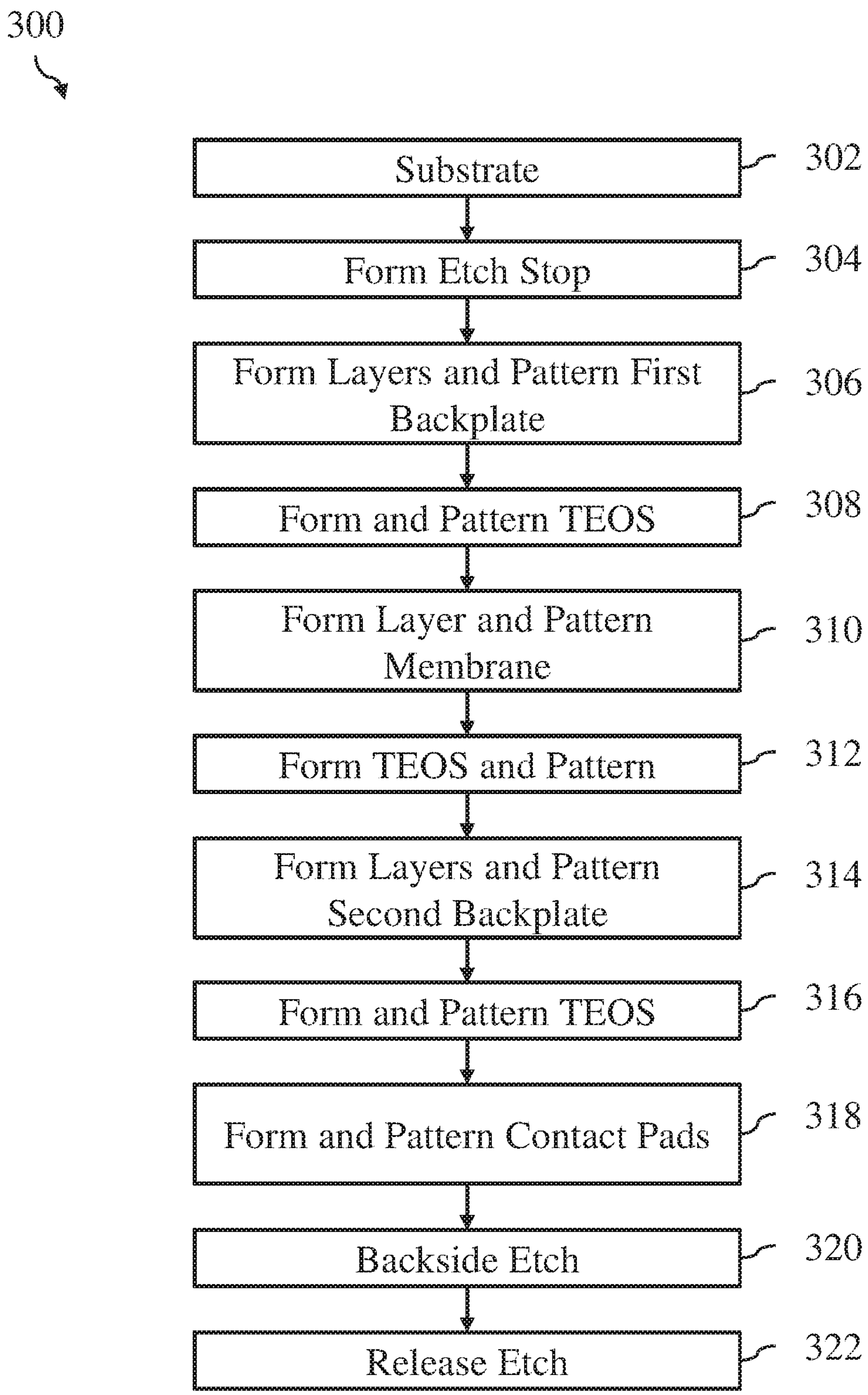
FIG. 8 illustrates a block diagram of an embodiment method of forming a MEMS transducer.

FIG. 8 illustrates a block diagram of an embodiment method of forming a MEMS transducer using fabrication sequence 300 that includes steps 302-322. According to various embodiments, fabrication sequence 300 begins with a substrate in step 302. The substrate may be formed of a semiconductor, such as silicon, or as another material, such as a polymer for example. An etch stop layer is formed on the substrate in step 304. The etch stop layer may be silicon nitride or silicon oxide, for example. In step 306, a first backplate is formed by forming and patterning layers for the first backplate. In various embodiments, the first backplate may be formed and patterned according to any of the embodiments described hereinabove in reference to FIGS. 6*a*-6*l*, for example. Further description of embodiment processing steps for forming the first backplate are described herein below in reference to FIGS. 9*a*, 9*b*, and 9*c*.

In various embodiments, step 308 includes forming and patterning a structural material, such as TEOS oxide. Forming and patterning in step 308 is performed in order to provide spacing for a membrane. The structural layer may be patterned in order to form anti-stiction bumps for the membrane. In addition, the structural layer formed in step 308 may include multiple depositions and a planarization step, such as a chemical mechanical polish (CMP). Step 310 includes forming the membrane layer and patterning the membrane. The membrane layer may be formed of polysilicon, for example. In other embodiments, the membrane layer may be formed of other conductive materials, such as a doped semiconductor or a metal, for example. In various embodiments, the membrane may be formed and patterned according to any of the embodiments described hereinabove in reference to FIGS. 6*a*-6*l*, for example. Further description of embodiment processing steps for forming the membrane are described herein below in reference to FIGS. 9*a*, 9*b*, and 9*c*. Patterning the membrane layer in step 310 may include a photolithographic process, for example, that defines the membrane shape or structure. The membrane may include anti-stiction bumps based on the structure formed in step 308.

In various embodiments, step 312 includes forming and patterning additional structural material, such as TEOS oxide. Similar to step 308, the structural material may be formed and patterned in step 312 to space a second backplate from the membrane and provide anti-stiction bumps in the second backplate. Step 314 includes forming and patterning the layers of the second backplate. In some embodiments, forming and patterning in step 314 includes deposition of layers and photolithographic patterning, for example. In various embodiments, the second backplate may be omitted. In other embodiments where the second backplate is not omitted, the second backplate may be formed and patterned according to any of the embodiments described hereinabove in reference to FIGS. 6*a*-6*l*, for example. Further description of embodiment processing steps for forming the second backplate are described herein below in reference to FIGS. 9*a*, 9*b*, and 9*c*.

Following step 314, step 316 includes forming and patterning additional structural material in various embodiments. The structural material may be TEOS oxide. In some embodiments, the structural material is deposited as a sacrificial material or a masking material for subsequent etch or patterning steps. Step 318 includes forming and patterning contact pads. Forming and patterning the contact pads in step 318 may include etching contact holes in the existing layers to provide openings to the second backplate, membrane, first backplate, and substrate, as well as openings to the conductive layers formed as part of the first backplate, membrane, or second backplate to implement various electrodes or dipole electrodes as described hereinabove in reference to the other figures. After forming the openings to each respective structure or layer, the contact pads may be formed by depositing a conductive material, such as a metal, in the openings and patterning the conductive material to form separate contact pads. The metal may be aluminum, silver, or gold in various embodiments. Alternatively, the metallization may include a conductive paste, for example, or other metals, such as copper.

In various embodiments, step 320 includes performing a backside etch, such as a Bosch etch. The backside etch forms a cavity in the substrate that may be coupled to a sound port for the fabricated microphone or may form a reference cavity. Step 322 includes performing a release etch to remove the structural materials protecting and securing the first backplate, membrane, and second backplate. Following the release etch in step 322, the membrane may be free to move in some embodiments.

As described hereinabove, fabrication sequence 300 may be modified in specific embodiments to include only a single backplate and membrane. Those of skill in the art will readily appreciate that numerous modifications may be made to the general fabrication sequence described hereinabove in order to provide various benefits and modifications known to those of skill in the art while still including various embodiments of the present invention. In some embodiments, fabrication sequence 300 may be implemented to form a MEMS microspeaker or a MEMS microphone, for example, or a pressure sensor in other embodiments. In still other embodiments, fabrication sequence 300 may be implemented to form any type of MEMS transducer including embodiment electrode structures as described herein.

Figure 9A:
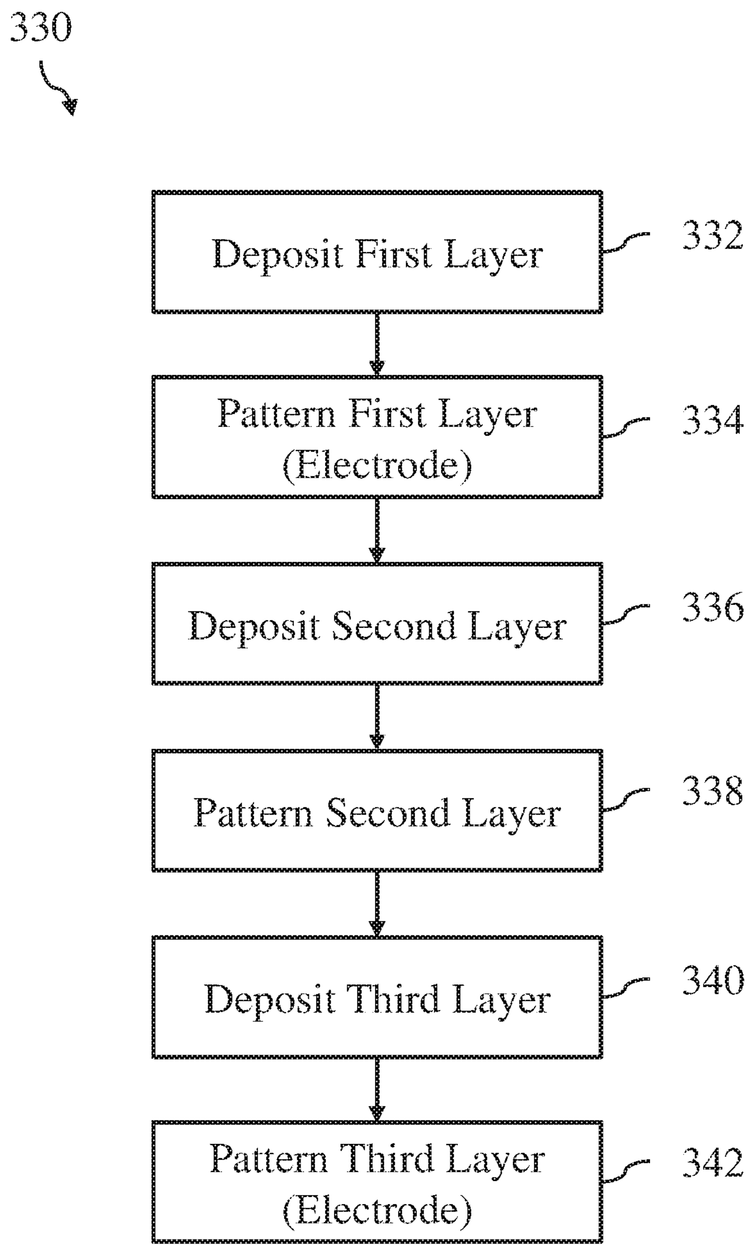
FIGS. 9*a*, 9*b*, and 9*c* illustrate block diagrams of embodiment methods of forming multi-electrode elements.
Figure 9B:
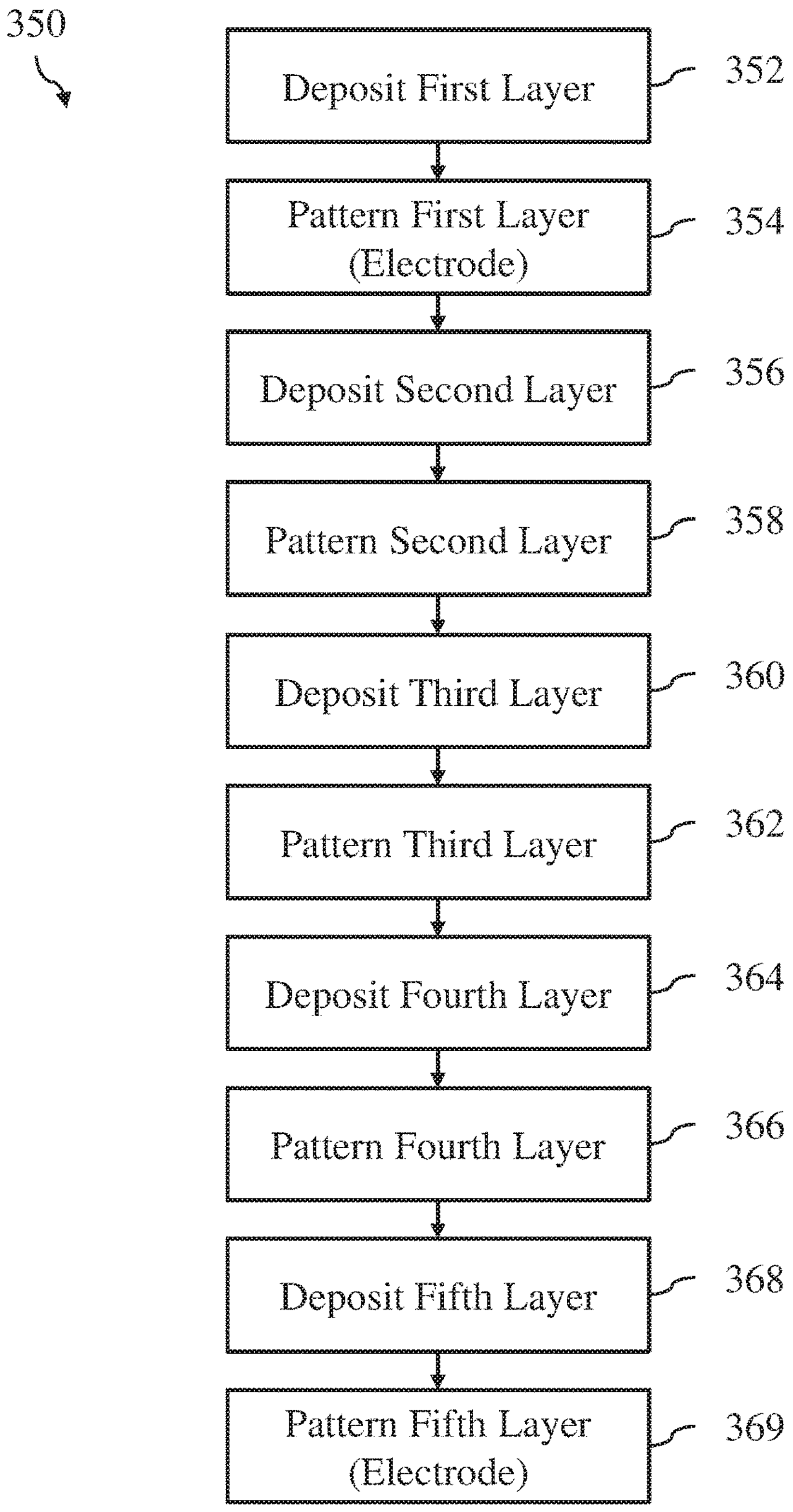
Figure 9C:
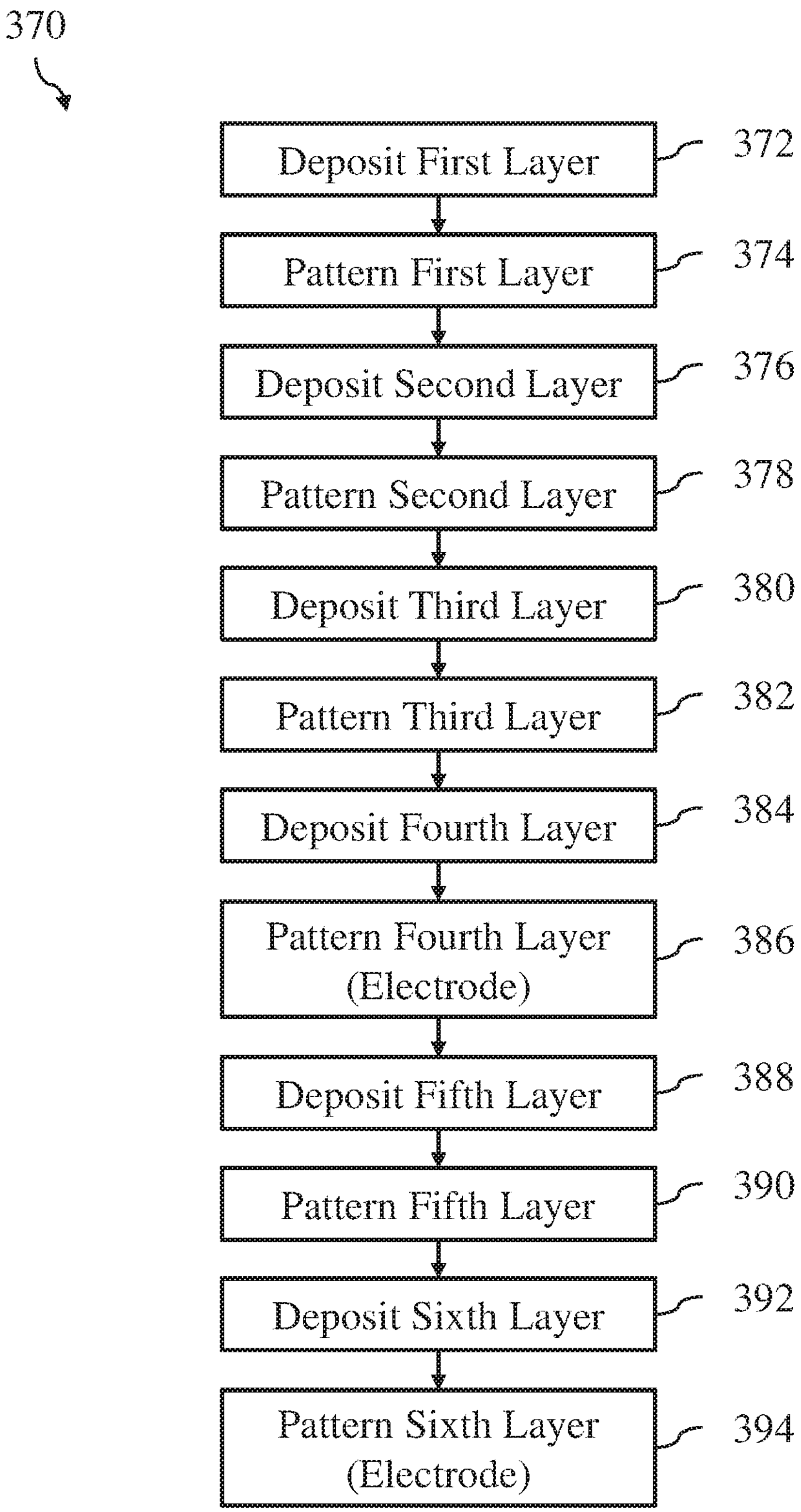

FIGS. 9*a*, 9*b*, and 9*c* illustrate block diagrams of embodiment methods of forming multi-electrode elements using fabrication sequence 330, fabrication sequence 350, and fabrication sequence 370. According to various embodiments, fabrication sequence 330, fabrication sequence 350, and fabrication sequence 370 form multi-electrode elements as descried hereinabove in reference to FIGS. 6*a*-6*l*. Further, fabrication sequence 330, fabrication sequence 350, and fabrication sequence 370 described embodiment fabrication sequences for forming the first backplate in step 306, forming the membrane in step 310, or forming the second backplate in step 314, as described hereinabove in reference to FIG. 8.

FIG. 9*a* illustrates fabrication sequence 330 for forming a three layer structure with patterned electrodes, such as a backplate or membrane in some embodiments. For example, fabrication sequence 330 may be used to form multi-electrode element 200*a* or multi-electrode element 200*e* as described hereinabove in reference to FIGS. 6*a*, 6*b*, and 6*h*.

Fabrication sequence 330 includes steps 332-342. According to various embodiments, step 332 includes depositing or forming a first layer on a first surface. The first layer is a conductive layer. In such embodiments, a patternable structural material, such as TEOS oxide, may be the first surface as described hereinabove in reference to steps 308, 312, or 316 in FIG. 8, and the first layer is formed or deposited on the TEOS oxide layer. The first layer is polysilicon in some embodiments. In other embodiments, the first layer is a metal such as silver, gold, aluminum, or platinum. In further embodiments, the first layer is any type of semiconductor, such as a doped semiconductor material. In alternative embodiments, the first layer may be another metal, such as copper. The first layer may be deposited or formed using any of the methods known to those of skill in the art to be compatible with the material selected for deposition or formation, such as electroplating, chemical vapor deposition (CVD), or physical vapor deposition (PVD), for example.

Following step 332, step 334 includes patterning the first layer to form patterned electrodes. In such embodiments, the patterning of step 334 may include a lithographic process including applying a photoresist, patterning the photoresist using a mask for exposure and a developer solution, and etching the first layer according to the patterned photoresist. In various embodiments, step 334 may include photolithography, electron beam lithography, ion beam or lithography. In still further embodiments, step 334 may include x-ray lithography, mechanical imprint patterning, or microscale (or nanoscale) printing techniques. Still further approaches for patterning the first layer may be used in some embodiments, as will be readily appreciated by those of skill in the art. In step 334, the first layer may be patterned to form concentric circles, as described hereinabove in reference to FIGS. 4*a*, 4*b*, 4*c*, 4*d*, and 5.

In some embodiments, the first layer may also include electrical connections as described hereinabove in reference to first electrical connections 208 in FIGS. 6*b*. Thus, step 334 may include patterning the electrical connections. In various embodiments, the electrical connections may include a thinned first layer, as described hereinabove in reference to second electrical connections 210 in FIG. 6*g*, or an additional forming and patterning step with another material.

Before step 336, an additional step of depositing or forming a sacrificial layer and performing a planarization step on the sacrificial layer and the first layer may be included. For example, a chemical mechanical polish (CMP) may be applied to the sacrificial layer and the first layer. In various embodiments, step 336 includes depositing or forming a second layer on the patterned first layer. The second layer is an insulating layer.

In some embodiments, the second layer is a nitride, such as silicon nitride. In other embodiments, the second layer is an oxide, such as silicon oxide. The second layer may be another type of suitable dielectric or insulator in further embodiments. In an alternative embodiment, the second layer may be formed of a polymer. In one embodiment, the second layer may be a TEOS oxide. In various embodiments, the second layer may be deposited or formed using any of the methods known to those of skill in the art to be compatible with the material selected for deposition or formation, such as CVD, PVD, or thermal oxidation for example.

Step 338 includes patterning the second layer. Patterning the second layer may be performed using any of the techniques described in reference to step 334. The second layer may be patterned to form a membrane or a backplate in some embodiments. For example, the second layer may be patterned to form a circular membrane. In embodiments where fabrication sequence 330 is used to form a backplate for a MEMS acoustic transducer, the second layer may also be patterned to form perforations. Similarly, in other embodiments involving other structures for other types of transducers, the second layer may be patterned according to the specific type of transducer.

Following step 338, step 340 includes depositing or forming a third layer on top of the second layer. The third layer is a conductive layer that may be formed using any of the techniques or materials described in reference to step 332.

Step 342 includes patterning the third layer to form patterned electrodes and electrical connections. Patterning the third layer may be performed using any of the techniques described in reference to step 334. In step 342, the third layer may be patterned to form concentric circles, or other patterns, as described hereinabove in reference to FIGS. 4*a*, 4*b*, 4*c*, 4*d*, and 5. In various embodiments the patterned electrodes formed in steps 334 and 342 may together form positive and negative poles for dipole electrodes, such as described hereinabove in reference to FIGS. 3*a* and 6*a*, for example.

In various embodiments, fabrication sequence 330 may be used to form a backplate or a membrane. In some embodiments, either the first layer or the third layer may be omitted. For examples, in embodiments for forming multi-electrode plates or structures as described hereinabove in reference to FIGS. 3*c*, 3*d*, 4*a*, 4*c*, 4*d*, and 5, the first layer or the second layer may be omitted. Fabrication sequence 330 may also be used to form a layered multi-electrode structure for other types of MEMS transducers.

FIG. 9*b* illustrates fabrication sequence 350 for forming a five layer structure with patterned electrodes, such as a backplate or membrane in some embodiments. For example, fabrication sequence 350 may be used to form multi-electrode element 200*b* as described hereinabove in reference to FIGS. 6*c* and 6*d*. Fabrication sequence 350 includes steps 352-369. According to various embodiments, step 352 includes depositing or forming a first layer on a first surface. In such embodiments, a patternable structural material, such as TEOS oxide, may be the first surface as described hereinabove in reference to steps 308, 312, or 316 in FIG. 8, and the first layer is formed or deposited on the TEOS oxide layer. The first layer is a conductive layer that may be formed using any of the techniques or materials described hereinabove in reference to step 332 in FIG. 9*a*.

Following step 352, step 354 includes patterning the first layer to form patterned electrodes and electrical connections. Patterning the first layer in step 354 may be performed using any of the techniques described hereinabove in reference to step 334 in FIG. 9*a*. In step 354, the first layer may be patterned to form concentric circles, as described hereinabove in reference to FIGS. 4*a*, 4*b*, 4*c*, 4*d*, and 5.

Before step 356, an additional step of depositing or forming a sacrificial layer and performing a planarization step on the sacrificial layer and the first layer may be included. For example, a chemical mechanical polish (CMP) may be applied to the sacrificial layer and the first layer. In various embodiments, step 356 includes depositing or forming a second layer on the patterned first layer. The second layer in step 356 is an insulating layer that may be formed using any of the techniques or materials described hereinabove in reference to step 336 in FIG. 9*a*. Step 358 includes patterning the second layer. Patterning the second layer in step 358 may be performed using any of the techniques described hereinabove in reference to step 334 in FIG. 9*a*.

Following step 358, step 360 includes depositing or forming a third layer on top of the second layer. The third layer in step 360 is a conductive layer that may be formed using any of the techniques or materials described hereinabove in reference to step 332 in FIG. 9*a*. In particular embodiments, the third layer is a polysilicon layer that is formed using a CVD process. In such particular embodiments, the polysilicon third layer is thicker than the second layer and a fourth layer. For example, the third layer is the structural layer for a membrane or a backplate, while the second and fourth layers are thin insulation layers. Step 362 includes patterning the third layer. Patterning the third layer in step 362 may be performed using any of the techniques described hereinabove in reference to step 334 in FIG. 9*a*.

In various embodiments, step 364 includes depositing or forming a fourth layer on top of the third layer. The fourth layer in step 364 is an insulating layer that may be formed using any of the techniques or materials described hereinabove in reference to step 336 in FIG. 9*a*. Step 366 includes patterning the fourth layer. Patterning the fourth layer in step 366 may be performed using any of the techniques described hereinabove in reference to step 334 in FIG. 9*a*.

According to various embodiments, the second layer, the third layer, and the fourth layer may together form a backplate or a membrane for a MEMS acoustic transducer. Thus, the second layer, the third layer, and the fourth layer may be patterned to form a membrane or a backplate in such embodiments. For example, the second layer, the third layer, and the fourth layer may be patterned, in each separate patterning step or together in a single patterning step, to form a circular membrane. In embodiments where fabrication sequence 350 is used to form a backplate for a MEMS acoustic transducer, the second layer, the third layer, and the fourth layer may also be patterned to form perforations. Similarly, in other embodiments involving other structures for other types of transducers, the second layer, the third layer, and the fourth layer may be patterned according to the specific type of transducer.

Step 368 includes depositing or forming a fifth layer on top of the fourth layer. The fifth layer is a conductive layer that may be formed using any of the techniques or materials described hereinabove in reference to step 332 in FIG. 9*a*. Following step 368, step 369 includes patterning the fifth layer to form patterned electrodes and electrical connections. Patterning the fifth layer in step 369 may be performed using any of the techniques described hereinabove in reference to step 334 in FIG. 9*a*. In step 369, the fifth layer may be patterned to form concentric circles, as described hereinabove in reference to FIGS. 4*a*, 4*b*, 4*c*, 4*d*, and 5. In various embodiments the patterned electrodes formed in steps 354 and 369 may together form positive and negative poles for dipole electrodes, such as described hereinabove in reference to FIGS. 3*a* and 6*c*, for example.

In various embodiments, fabrication sequence 350 may be used to form a backplate or a membrane. In some embodiments, either the first and second layers or the fourth and fifth layers may be omitted. For examples, in embodiments for forming multi-electrode plates or structures as described hereinabove in reference to FIGS. 3*c*, 3*d*, 4*a*, 4*c*, 4*d*, and 5, the first and second layers or the fourth and fifth layers may be omitted. Fabrication sequence 350 may also be used to form a layered multi-electrode structure for other types of MEMS transducers.

FIG. 9*c* illustrates fabrication sequence 370 for forming a six layer structure with patterned electrodes, such as a backplate or membrane in some embodiments. For example, fabrication sequence 370 may be used to form multi-electrode element 200*c* or multi-electrode elements 200*d* as described hereinabove in reference to FIGS. 6*e*, 6*f*, 6*g*, 6*k*, and 6*l*. Fabrication sequence 370 includes steps 372-394. According to various embodiments, step 372 includes depositing or forming a first layer on a first surface. In such embodiments, a patternable structural material, such as TEOS oxide, may be the first surface as described hereinabove in reference to steps 308, 312, or 316 in FIG. 8, and the first layer is formed or deposited on the TEOS oxide layer. The first layer in step 372 is an insulating layer that may be formed using any of the techniques or materials described hereinabove in reference to step 336 in FIG. 9*a*. Step 374 includes patterning the first layer. Patterning the first layer in step 374 may be performed using any of the techniques described hereinabove in reference to step 334 in FIG. 9*a*.

Following step 374, step 376 includes depositing or forming a second layer on top of the first layer. The second layer in step 376 is a conductive layer that may be formed using any of the techniques or materials described hereinabove in reference to step 332 in FIG. 9*a* and in reference to step 360 in FIG. 9*b*. In particular embodiments, the second layer is a polysilicon layer that is formed using a CVD process. In such particular embodiments, the polysilicon second layer is thicker than the first layer and a third layer. For example, the second layer is the structural layer for a membrane or a backplate, while the first and third layers are thin insulation layers. Step 378 includes patterning the second layer. Patterning the second layer in step 378 may be performed using any of the techniques described hereinabove in reference to step 334 in FIG. 9*a*.

In various embodiments, step 380 includes depositing or forming a third layer on top of the second layer. The third layer in step 380 is an insulating layer that may be formed using any of the techniques or materials described hereinabove in reference to step 336 in FIG. 9*a*. Step 382 includes patterning the third layer. Patterning the third layer in step 382 may be performed using any of the techniques described hereinabove in reference to step 334 in FIG. 9*a*.

According to various embodiments, the first layer, the second layer, and the third layer may together form a backplate or a membrane for a MEMS acoustic transducer. Thus, the first layer, the second layer, and the third layer may be patterned to form a membrane or a backplate in such embodiments. For example, the first layer, the second layer, and the third layer may be patterned, in each separate patterning step or together in a single patterning step, to form a circular membrane. In embodiments where fabrication sequence 370 is used to form a backplate for a MEMS acoustic transducer, the first layer, the second layer, and the third layer may also be patterned to form perforations. Similarly, in other embodiments involving other structures for other types of transducers, the first layer, the second layer, and the third layer may be patterned according to the specific type of transducer.

In various embodiments, step 384 includes depositing or forming a fourth layer on top of the third layer. The fourth layer is a conductive layer that may be formed using any of the techniques or materials described hereinabove in reference to step 332 in FIG. 9*a*. Following step 384, step 386 includes patterning the fourth layer to form patterned electrodes and electrical connections. Patterning the fourth layer in step 386 may be performed using any of the techniques described hereinabove in reference to step 334 in FIG. 9*a*. In step 386, the fourth layer may be patterned to form concentric circles, or other shapes, as described hereinabove in reference to FIGS. 4*a*, 4*b*, 4*c*, 4*d*, and 5.

In some embodiments, the fourth layer may also include electrical connections as described hereinabove in reference to second electrical connections 210 in FIGS. 6*f* and 6*g*. Thus, step 386 may include patterning the electrical connections. In various embodiments, the electrical connections may include a thinned fourth layer, as described hereinabove in reference to second electrical connections 210 in FIG. 6*g*, or an additional forming and patterning step with another material.

Before step 388, an additional step of depositing or forming a sacrificial layer and performing a planarization step on the sacrificial layer and the fourth layer may be included. For example, a CMP may be applied to the sacrificial layer and the fourth layer. In various embodiments, step 388 includes depositing or forming a fifth layer on the patterned fourth layer. The fifth layer in step 388 is an insulating layer that may be formed using any of the techniques or materials described hereinabove in reference to step 336 in FIG. 9*a*. Step 390 includes patterning the fifth layer to form insulation on the patterned electrodes of step 386. Patterning the fifth layer in step 390 may be performed using any of the techniques described hereinabove in reference to step 334 in FIG. 9*a*. In step 390, the fifth layer may be patterned to form concentric circles matching and on top of the concentric circles of the patterned electrodes of step 386, as described hereinabove in reference to FIGS. 4*a*, 4*b*, 4*c*, 4*d*, and 5.

Before step 392, as before step 388, an additional step of depositing or forming a sacrificial layer and performing a planarization step on the sacrificial layer and the fifth layer may be included. For example, a CMP may be applied to the sacrificial layer and the fifth layer. Step 392 includes depositing or forming a sixth layer on top of the fifth layer. The sixth layer is a conductive layer that may be formed using any of the techniques or materials described hereinabove in reference to step 332 in FIG. 9*a*.

Following step 392, step 394 includes patterning the sixth layer to form patterned electrodes on top of the patterned electrodes of step 386 and the insulation of step 390. Step 394 may also include forming patterned electrical connections. Patterning the sixth layer in step 394 may be performed using any of the techniques described hereinabove in reference to step 334 in FIG. 9*a*. In step 394, the sixth layer may be patterned to form concentric circles on top of the concentric circles of the patterned electrode in step 386, as described hereinabove in reference to FIG. 4*b*. In various embodiments the patterned electrodes formed in steps 386 and 394 may together form positive and negative poles for dipole electrodes, such as described hereinabove in reference to FIGS. 3*b* and 6*e*, for example.

In some embodiments, the sixth layer may also include electrical connections as described hereinabove in reference to third electrical connections 224 in FIGS. 6*f* and 6*g*. Thus, step 394 may include patterning the electrical connections. In various embodiments, the electrical connections may include a thinned sixth layer, as described hereinabove in reference to third electrical connections 224 in FIG. 6*g*, or an additional forming and patterning step with another material.

In other embodiments, the patterned electrodes formed in step 394 may not be placed on top of the patterned electrodes of step 386. Instead, step 394 includes patterning the electrodes in, for example, concentric circles offset from the concentric circles of the patterned electrodes of step 386. For example, step 386 and step 394 may together include patterning electrodes as described hereinabove in reference to FIGS. 4*a*, 6*k*, and 6*l*.

In various embodiments, fabrication sequence 370 may be used to form a backplate or a membrane. In some embodiments, the first layer may be omitted. For examples, in embodiments for forming multi-electrode plates or structures as described hereinabove in reference to FIGS. 3*b*, 3*f*, 6*e*, 6*f*, and 6*g*, the first layer that is an insulating layer connected to the bottom side of the plate (membrane or backplate) may be omitted. Fabrication sequence 370 may also be used to form a layered multi-electrode structure for other types of MEMS transducers.

In particular embodiments, fabrication sequence 370 includes forming patterned dipole electrodes on a top surface, i.e., as layers four, five, and six, as described hereinabove in reference to FIGS. 6*e*, 6*f*, and 6*g*, for example. In other embodiments, fabrication sequences 370 may be modified to form the patterned dipole electrodes on a bottom surface. In such embodiments, steps 384-394 may be performed first and steps 372-382 may be performed second. Thus, the first layer, the second layer, and the third layer may form a membrane or a backplate, for example, and dipole electrodes may be formed on either the top surface or the bottom surface of the membrane or the backplate formed by the first layer, the second layer, and the third layer.

In further particular embodiments, fabrication sequence 370 may be modified to form structures as described hereinabove in reference to FIGS. 6*i* and 6*j*. In such embodiments, the first layer and the second layer, formed in steps 372-378, may be omitted. Thus, the third layer may be formed first. In such embodiments, the third layer is formed as a thicker structural layer as described and shown hereinabove in reference to insulating layer 202 in FIGS. 6*i* and 6*j*.

In other embodiments, structure variations and material alternatives are envisioned for fabrication sequence 330, fabrication sequence 350, and fabrication sequence 370. In some alternative embodiments, a backplate or membrane may be formed of any number of layers, conductive or insulating. For example, in some embodiments, the backplate or membrane may include layers of metals, semiconductors, or dielectrics. A dielectric layer may be used to separate a conductive sensing layer from electrodes. In some embodiments, the backplate or membrane may be formed of silicon on insulator (SOI) or metal and dielectric layers.

Figure 10A:
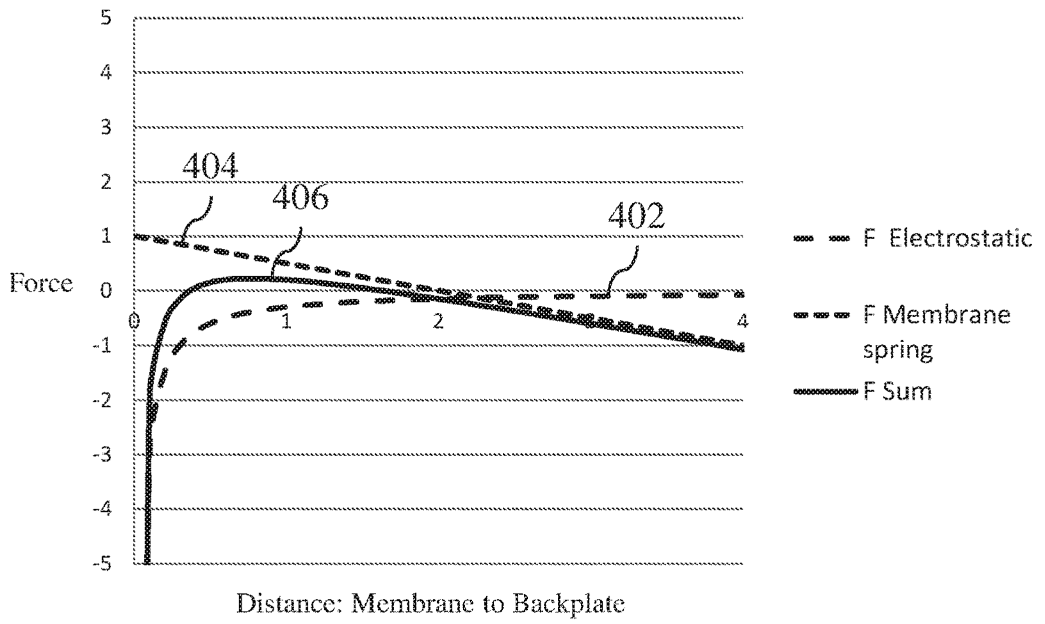
FIGS. 10*a* and 10*b* illustrate force plots of two transducers.
Figure 10B:
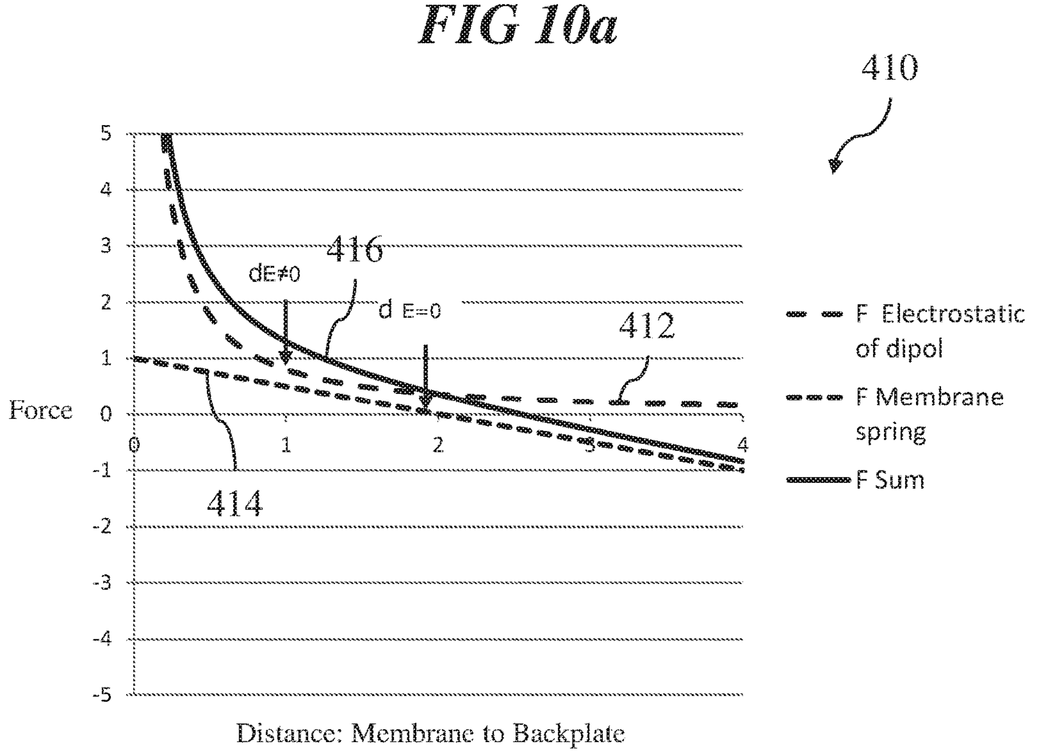

FIGS. 10*a* and 10*b* illustrate force plots 400 and 410 of two transducers. FIG. 10*a* illustrates force plot 400 of a typical transducer without a dipole electrode including electrostatic force curve 402, membrane spring force curve 404, and summation force curve 406, which is the sum of electrostatic force curve 402 and membrane spring force curve 404. As shown, summation force curve 406 becomes very negative, i.e., attractive, for smaller distances between the membrane and backplate. This behavior leads to pull-in or collapse of the backplate and membrane and is caused by the relationship between the electrostatic force and the distance between the charged plates, which includes the distance in the denominator of the electrostatic force equation.

FIG. 10*b* illustrates force plot 410 of an embodiment multi-electrode transducer with a dipole electrode including electrostatic force curve 412, membrane spring force curve 414, and summation force curve 416, which is the sum of electrostatic force curve 412 and membrane spring force curve 414. As shown, summation force curve 416 becomes increasingly positive, i.e., repulsive, for smaller distances between the membrane and backplate. This behavior of various embodiments prevents pull-in or collapse of the backplate and membrane and is caused by the presence of various embodiment dipole electrodes described hereinabove in reference to the other figures.

According to an embodiment, a MEMS transducer includes a stator, a rotor spaced apart from the stator, and a multi-electrode structure including electrodes with different polarities. The multi-electrode structure is formed on one of the rotor and the stator and is configured to generate a repulsive electrostatic force between the stator and the rotor. Other embodiments include corresponding systems and apparatus, each configured to perform corresponding embodiment methods.

Implementations may include one or more of the following features. In various embodiments, the stator includes a backplate, the rotor includes a membrane, and the MEMS transducer is a MEMS microphone or a MEMS microspeaker. In some embodiments, the multi-electrode structure includes a first plurality of dipole electrodes. In other embodiments, the rotor includes the first plurality of dipole electrodes and the stator includes a conductive layer. In further embodiments, the stator includes the first plurality of dipole electrodes and the rotor includes a conductive layer. In specific embodiments, the stator includes the first plurality of dipole electrodes and the rotor includes a second plurality of dipole electrodes.

In various embodiments, each dipole electrode of the first plurality of dipole electrodes includes a positive pole and a negative pole formed on a same surface of the rotor or the stator. In some embodiments, for each dipole electrode of the first plurality of dipole electrodes, the positive pole and the negative pole are separated by an insulating layer and formed as a layered stack on the same surface of the rotor or the stator. In further embodiments, for each dipole electrode of the first plurality of dipole electrodes, the positive pole and the negative pole are formed spaced apart on the same surface of the rotor or the stator.

In various embodiments, the first plurality of dipole electrodes is formed as concentric electrodes with alternative positive and negative poles. In some embodiments, each dipole electrode of the first plurality of dipole electrodes includes a positive pole formed on a first surface and a negative pole formed on a second surface, where the first surface is an opposite surface of the second surface and both the first surface and the second surface are on either the rotor or the stator. In further embodiments, the MEMS transducer further includes an insulating layer formed between the first surface and the second surface. In still further embodiments, the MEMS transducer further includes a conductive layer formed with insulating layers formed between the first surface and the conductive layer and between the second surface and the conductive layer. In such embodiments, the first plurality of dipole electrodes may be formed as concentric electrodes on the first surface and on the second surface. The multi-electrode structure may include a first discontinuous electrode formed of a conductive layer on a first surface of the rotor or the stator, where the first discontinuous electrode includes a plurality of first concentric electrode portions coupled to a first electrode connection and including a break in each electrode portion of the plurality of first concentric electrode portions.

In particular embodiments, the multi-electrode structure further includes a second discontinuous electrode formed of the conductive layer on the first surface, where the second discontinuous electrode includes a plurality of second concentric electrode portions coupled to a second electrode connection and includes a break in each electrode portion of the plurality of second concentric electrode portions. In such embodiments, the first concentric electrode portions and the second concentric electrode portions are arranged in alternating concentric structures such that each first concentric electrode portion of the first concentric electrode portions is adjacent a second concentric electrode portion of the second concentric electrode portions.

According to an embodiment, a MEMS device with a deflectable structure includes a first structure and a second structure, where the first structure is spaced apart from the second structure and the first structure and the second structure are configured to vary a distance between portions of the first structure and the second structure during deflections of the deflectable structure. In such embodiments, the first structure includes a first electrode configured to have a first charge polarity and a second electrode configured to have a second charge polarity, where the second charge polarity is different from the first charge polarity. The second structure includes a third electrode configured to have the first charge polarity. Other embodiments include corresponding systems and apparatus, each configured to perform corresponding embodiment methods.

Implementations may include one or more of the following features. In various embodiments, the first structure includes the deflectable structure and the second structure includes a rigid structure. In some embodiments, the MEMS device is an acoustic transducer, the deflectable structure includes a deflectable membrane, and the rigid structure includes a rigid perforated backplate. In further embodiments, the first structure includes a rigid structure and the second structure includes the deflectable structure. In particular embodiments, the MEMS device is an acoustic transducer, the rigid structure includes a rigid perforated backplate, and the deflectable structure includes a deflectable membrane.

According to an embodiment, a method of forming a MEMS device includes forming a first structure, forming a structural layer in contact with the first structure around a circumference of the first structure, and forming a second structure. The first structure includes a dipole electrode including a first electrode and a second electrode. The second structure includes a third electrode. In such embodiments, the structural layer is in contact with the second structure around a circumference of the second structure and the first structure is spaced apart from the second structure by the structural layer. Other embodiments include corresponding systems and apparatus, each configured to perform corresponding embodiment methods.

Implementations may include one or more of the following features. In various embodiments, forming the first structure includes forming a first structural layer, forming a plurality of first electrodes on a top surface of the first structural layer, and forming a plurality of second electrodes on a bottom surface of the first structural layer. In some embodiments, forming the first structural layer includes forming a first insulating layer. Forming the first structural layer may include forming a first conducting layer, forming a first insulating layer on a top surface of the first conducting layer, and forming a second insulating layer on a bottom surface of the first conducting layer.

In various embodiments, forming the first structure includes forming a first structural layer, forming a plurality of first electrodes on a first surface of the first structural layer, and forming a plurality of second electrodes on the first surface of the first structural layer. In some embodiments, forming the first structural layer includes forming a first conducting layer and forming a first insulating layer between the first conducting layer and both the plurality of first electrodes and the plurality of second electrodes. In particular embodiments, the plurality of first electrodes and the plurality of second electrodes are formed on and in contact with first insulating layer. The plurality of second electrodes may be formed overlying the plurality of first electrodes, and forming the first structure may further include forming a second insulating layer between the plurality of first electrodes and the plurality of second electrodes.

According to various embodiments described herein, an advantage may include MEMS transducers having movable electrodes with low risk of collapse, i.e., pull-in, for the electrodes due to embodiment multi-electrode configurations described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectromechanical systems (MEMS) device, the MEMS device comprising:
- a deflectable structure;
- a first structure comprising
  - a first electrode configured to have a first charge polarity, and
  - a second electrode configured to have a second charge polarity, wherein the second charge polarity is different from the first charge polarity;
- a second structure comprising a third electrode configured to have the first charge polarity; and
- wherein
  - the first structure is spaced apart from the second structure,
  - the first structure and the second structure are configured to vary a distance between portions of the first structure and the second structure during deflections of the deflectable structure, and
  - the first electrode and the second electrode are configured to
    - generate a net repulsive electrostatic force between the first structure and the second structure when one or more bias voltages are applied to the first electrode and the second electrode,
    - generate the net repulsive electrostatic force between the first structure and the second structure when the first structure and the second structure are separated by a first distance, and
    - generate a net attractive electrostatic force between the first structure and the second structure when the first structure and the second structure are separated by a second distance that is larger than the first distance.

2. The MEMS device of claim 1, wherein the first structure comprises the deflectable structure and the second structure comprises a rigid structure.

3. The MEMS device of claim 2, wherein:
- the MEMS device is an acoustic transducer;
- the deflectable structure comprises a deflectable membrane; and
- the rigid structure comprises a rigid perforated backplate.

4. The MEMS device of claim 1, wherein the first structure comprises a rigid structure and the second structure comprises the deflectable structure.

5. The MEMS device of claim 4, wherein:
- the MEMS device is an acoustic transducer;
- the rigid structure comprises a rigid perforated backplate; and
- the deflectable structure comprises a deflectable membrane.

6. A method of forming a microelectromechanical systems (MEMS) device, the method comprising:
- forming a first structure comprising a dipole electrode including a first electrode and a second electrode;
- forming a structural layer in contact with the first structure around a circumference of the first structure; and
- forming a second structure comprising a third electrode, wherein
  - the structural layer is in contact with the second structure around a circumference of the second structure,
  - the first structure is spaced apart from the second structure by the structural layer, and
  - the first electrode and the second electrode are configured to
    - generate a net repulsive electrostatic force between the first structure and the second structure when one or more bias voltages are applied to the first electrode and the second electrode,
    - generate the net repulsive electrostatic force between the first structure and the second structure when the first structure and the second structure are separated by a first distance, and
    - generate a net attractive electrostatic force between the first structure and the second structure when the first structure and the second structure are separated by a second distance that is larger than the first distance.

7. The method of claim 6, wherein forming the first structure comprises:
- forming a first structural layer;
- forming a plurality of first electrodes on a top surface of the first structural layer; and
- forming a plurality of second electrodes on a bottom surface of the first structural layer.

8. The method of claim 7, wherein forming the first structural layer comprises forming a first insulating layer.

9. The method of claim 7, wherein forming the first structural layer comprises:
- forming a first conducting layer;
- forming a first insulating layer on a top surface of the first conducting layer; and
- forming a second insulating layer on a bottom surface of the first conducting layer.

10. The method of claim 6, wherein forming the first structure comprises:
- forming a first structural layer;
- forming a plurality of first electrodes on a first surface of the first structural layer; and
- forming a plurality of second electrodes on the first surface of the first structural layer.

11. The method of claim 10, wherein forming the first structural layer comprises:
- forming a first conducting layer; and
- forming a first insulating layer between the first conducting layer and both the plurality of first electrodes and the plurality of second electrodes.

12. The method of claim 11, wherein the plurality of first electrodes and the plurality of second electrodes are formed on and in contact with first insulating layer.

13. The method of claim 11, wherein the plurality of second electrodes are formed overlying the plurality of first electrodes; and forming the first structure further comprises forming a second insulating layer between the plurality of first electrodes and the plurality of second electrodes.

14. A microelectromechanical systems (MEMS) device, the MEMS device comprising:

a deflectable structure;

a rigid structure spaced apart from the deflectable structure;

a first structure disposed on one of the deflectable structure or the rigid structure, the first structure comprising a first electrode configured to have a first charge polarity, a second electrode configured to have a second charge polarity, and wherein the second charge polarity is different from the first charge polarity; and wherein the first structure is configured to generate a net repulsive electrostatic force between the deflectable structure and the rigid structure when one or more bias voltages are applied to the first structure, generate the net repulsive electrostatic force between the deflectable structure and the rigid structure when the deflectable structure and the rigid structure are separated by a first distance, and generate a net attractive electrostatic force between the deflectable structure and the rigid structure when the deflectable structure and the rigid structure are separated by a second distance that is larger than the first distance.

15. The MEMS device of claim 14, wherein the first structure is disposed on the deflectable structure.

16. The MEMS device of claim 14, wherein the first structure is disposed on the rigid structure.

17. The MEMS device of claim 14, wherein:

the MEMS device is an acoustic transducer;

the deflectable structure comprises a deflectable membrane; and the rigid structure comprises a rigid perforated backplate.

18. The MEMS device of claim 14, wherein the first electrode and the second electrode are configured to have a dipole moment that is substantially perpendicular to a first major surface of the rigid structure.

19. The MEMS device of claim 14, wherein the first electrode and the second electrode are separated by an insulating layer and formed as a layered stack disposed on a first major surface of the deflectable structure or the rigid structure.

20. The method of claim 6, wherein the dipole electrode is configured to have a dipole moment that is substantially perpendicular to a first major surface of the first structure.

* * * * *